US011205757B2

(12) United States Patent
Lee et al.

(10) Patent No.: US 11,205,757 B2
(45) Date of Patent: Dec. 21, 2021

(54) CORE-SHELL STRUCTURED PEROVSKITE PARTICLE LIGHT-EMITTER, METHOD OF PREPARING THE SAME AND LIGHT EMITTING DEVICE USING THE SAME

(71) Applicant: POSTECH ACADEMY-INDUSTRY FOUNDATION, Pohang-si (KR)

(72) Inventors: Taewoo Lee, Pohang-si (KR);
Sanghyuk Im, Hwaseong-si (KR);
Younghoon Kim, Daejeon (KR);
Himchan Cho, Daegu (KR)

(73) Assignee: SN DISPLAY CO., LTD.

( * ) Notice: Subject to any disclaimer, the term of this patent is extended or adjusted under 35 U.S.C. 154(b) by 0 days.

(21) Appl. No.: 15/524,735

(22) PCT Filed: Nov. 6, 2015

(86) PCT No.: PCT/KR2015/011960
§ 371 (c)(1),
(2) Date: Jul. 5, 2017

(87) PCT Pub. No.: WO2016/072806
PCT Pub. Date: May 12, 2016

(65) Prior Publication Data
US 2017/0346024 A1    Nov. 30, 2017

(30) Foreign Application Priority Data

Nov. 6, 2014   (KR) .................. 10-2014-0153970
Nov. 6, 2015   (KR) .................. 10-2015-0156175

(51) Int. Cl.
*H01L 51/50*   (2006.01)
*H01L 51/00*   (2006.01)
(Continued)

(52) U.S. Cl.
CPC .......... *H01L 51/0077* (2013.01); *B01J 13/06* (2013.01); *C09K 11/025* (2013.01); *C09K 11/06* (2013.01);
(Continued)

(58) Field of Classification Search
CPC ..................................................... H01L 51/502
(Continued)

(56) References Cited

U.S. PATENT DOCUMENTS 6,322,901 B1   11/2001 Bawendi et al.
6,777,871 B2   8/2004 Duggal et al.
(Continued)

FOREIGN PATENT DOCUMENTS

CN       104134711 A    11/2014
JP       2001060497 A    3/2001
(Continued)

OTHER PUBLICATIONS

Ayguler, et al., (Light-Emitting Electrochemical Cells Based on Hybrid Lead Halide Perovskite Nanoparticles).*
(Continued)

*Primary Examiner* — Niki Bakhtiari
(74) *Attorney, Agent, or Firm* — Renaissance IP Law Group LLP

(57) ABSTRACT

Provided are a core-shell structured perovskite particle light-emitter, a method of preparing the same, and a light emitting device using the same. The core-shell structured perovskite particle light-emitter or metal halide perovskite particle light-emitter has a perovskite nanocrystal structure and a core-shell structured particle structure. Therefore, in the perovskite particle light-emitter of the present invention, as a shell is formed of a substance having a wider band gap than that of a core, excitons may be more dominantly confined in the core, and durability of the nanocrystal may be improved (Continued)

to prevent exposure of the core perovskite to the air using a perovskite or inorganic semiconductor, which is stable in the air, or a polymer.

18 Claims, 10 Drawing Sheets

(51) Int. Cl.
| | |
|---|---|
| *C09K 11/02* | (2006.01) |
| *C09K 11/06* | (2006.01) |
| *C09K 11/66* | (2006.01) |
| *H01G 9/20* | (2006.01) |
| *H01L 51/42* | (2006.01) |
| *B01J 13/06* | (2006.01) |
| *B82Y 20/00* | (2011.01) |
| *B82Y 40/00* | (2011.01) |
| *B82Y 30/00* | (2011.01) |

(52) U.S. Cl.
CPC ......... *C09K 11/665* (2013.01); *H01G 9/2059* (2013.01); *H01L 51/0007* (2013.01); *H01L 51/426* (2013.01); *H01L 51/5032* (2013.01); *B82Y 20/00* (2013.01); *B82Y 30/00* (2013.01); *B82Y 40/00* (2013.01); *C09K 2211/10* (2013.01); *C09K 2211/188* (2013.01); *H01L 51/0037* (2013.01); *H01L 51/4253* (2013.01); *H01L 51/502* (2013.01); *H01L 51/5012* (2013.01); *Y10S 977/774* (2013.01); *Y10S 977/812* (2013.01); *Y10S 977/892* (2013.01); *Y10S 977/948* (2013.01); *Y10S 977/95* (2013.01)

(58) Field of Classification Search
USPC .................................................. 136/243–265
See application file for complete search history.

(56) References Cited

U.S. PATENT DOCUMENTS

| | | | |
|---|---|---|---|
| 8,109,153 B2 | 2/2012 | Kirst | |
| 9,109,153 B2 | 8/2015 | Shin et al. | |
| 10,633,584 B2 | 4/2020 | Zhong et al. | |
| 2001/0033135 A1 | 10/2001 | Duggal et al. | |
| 2002/0016306 A1* | 2/2002 | Hutchison | B82Y 10/00 514/44 R |
| 2004/0023010 A1* | 2/2004 | Bulovic | B82Y 20/00 428/209 |
| 2004/0095658 A1 | 5/2004 | Buretea et al. | |
| 2005/0061363 A1 | 3/2005 | Ginley et al. | |
| 2006/0236918 A1* | 10/2006 | Jun | B82Y 20/00 117/68 |
| 2007/0151597 A1* | 7/2007 | Chen | H01L 31/0352 136/256 |
| 2008/0014463 A1 | 1/2008 | Varadarajan et al. | |
| 2009/0305231 A1* | 12/2009 | Weidemaier | B82Y 5/00 435/5 |
| 2010/0051898 A1 | 3/2010 | Kim et al. | |
| 2010/0129529 A1 | 5/2010 | Shin et al. | |
| 2010/0294355 A1* | 11/2010 | Choi | H01L 31/03925 136/256 |
| 2011/0253217 A1* | 10/2011 | Grossman | H01L 51/4253 136/263 |
| 2012/0273726 A1* | 11/2012 | Zhuravleva | C09K 11/7733 252/301.4 H |
| 2013/0190493 A1* | 7/2013 | Naasani | C09K 11/025 544/200 |
| 2016/0380136 A1 | 12/2016 | Ning et al. | |
| 2017/0233645 A1 | 8/2017 | Zhong et al. | |
| 2017/0324057 A1 | 11/2017 | Friend et al. | |
| 2018/0196164 A1 | 7/2018 | Friend et al. | |
| 2019/0348577 A1 | 11/2019 | Pathak et al. | |

FOREIGN PATENT DOCUMENTS

| | | |
|---|---|---|
| JP | 2003309308 A | 10/2003 |
| JP | 2007173755 A | 7/2007 |
| JP | 2008227330 A | 9/2008 |
| JP | 2009006548 A | 1/2009 |
| JP | 2010037540 A | 2/2010 |
| JP | 2010061098 A | 3/2010 |
| JP | 1863745 B2 | 1/2012 |
| JP | 2018525671 A | 9/2018 |
| KR | 20010015084 A | 2/2001 |
| KR | 20100027892 A | 3/2010 |
| KR | 20100034003 A | 3/2010 |
| KR | 10-1165100 | 7/2012 |
| KR | 20140003998 A | 1/2014 |
| KR | 20140007045 A | 1/2014 |
| KR | 20140035287 A | 3/2014 |
| WO | 2013171517 A1 | 11/2013 |

OTHER PUBLICATIONS

Chen et al., Shape-controlled synthesis of organolead halide perovskite nanocrystals and their tunable optical absorption, 2014.*
Schmidt et al., "Nontemplate Synthesis of CH3NH3PbBr3 Perovskite Nanoparticles,", J. Am. Chem. Soc., 2014, 136, pp. 850-853, and Supporting Information S1-S17, published Jan. 3, 2014.
Dabbousl et al. "(CdSe)ZnS Core-Shell Quantum Dots: Synthesis and Characterization of a Size Series of Highly Luminescent Nanocrystallites," J.Phys. Chem. B, 1997, 101, pp. 9463-9475, published 1997.
Papervassillou et al., "Nanocrystalline/microcrystalline materials based on load-halide units," J. Mater.Chem., 2012, 22, pp. 8271-860, published 2012.
Mitzi, D. B. et al., "Organic-inorganic Electronics", IBM Journal of Research and Development, .Jan. 2001, vol. 45, No. 1, pp. 29-45.
Zhang, Wei et al., "Enhancement of Perovskite-Based Solar Cells Employing Core-Shell Metal Nanoparticles", Nano Letters, Aug. 15, 2013, vol. 13, pp. 4505-4510.
KIPO, International Search Report, Application No. of PCT/KR2015/011960, dated Apr. 11, 2016.
Gonzalez-Carrero et al., "Maximizing the emissive properties of CH3N H3PbBr3 perovskite nanoparticles", 2015, J. Mater. Chem. A, 2015,3,9187-9193, Jan. 2015.
International Search Report for PCT/KR2015/011957 dated Mar. 25, 2016.
International Search Report for PCT/KR2015/011958 dated Mar. 21, 2016.
International Search Report for PCT/KR2015/011959 dated Mar. 14, 2016.
International Search Report for PCT/KR2015/011963 dated Mar. 10, 2016.
Junwu, Zhu et al., "Solution-Phase Synthesis and Characterization of Perovskite LaCoO3 Nanocrystals via A CoPrecipitation Route", Journal of Rare Earths vol. 25, Issue 5, Oct. 2007, pp. 601-604.
Kojima, Akihiro et al., "Highly Luminescent Lead Bromide Perovskite Nanoparticles Synthesized with Porous Alumina Media", Chemistry Letters, Apr. 5, 2012, vol. 41, No. 4, pp. 397-399.
Koole, Rolf et al., "Size Effects on Semiconductor Nanoparticles", Nanoparticles, Springer-Verlag Berlin Heidelberg 2014, pp. 13-51.
Lim, Kyung-Geun et al., "Boosting the Power Conversion Efficiency of Perovskite Solar Cells Using Self-Organized Polymeric Hole Extraction Layers with High Work Function", Advance Materials, 2014, 26: 6461-6466.
Mali et al., "Highly stable and efficient solid-state solar cells based on methylammonium lead bromide CH3NH3PbBr3) perovskite quantum dots", NPG Asia Materials, Jun. 9, 2015, pp. 1-9.
Mitzi, D. B. et al., "Organic-inorganic electronics", IBM Journal of Research and Development, vol. 45, No. 1, Jan. 2001, pp. 29-45.
Muthu, Chinnadurai et al., "Luminescent hybrid perovskite nanoparticles as a new platform for selective detection of 2,4,6-trinitrophenol", RSC Advances, Issue 99, Oct. 2014, vol. 4, 55908-55911.
O'Brien, Stephen et al., "Synthesis of Monodisperse Nanoparticles of Barium Titanate: Toward a Generalized Strategy of Oxide

(56) References Cited

OTHER PUBLICATIONS

Nanoparticle Synthesis", J. Am. Chem. Soc. 2001, 123, 48, 12085-12086 Publication Date Nov. 7, 2001.
Papavassiliou, G. C., "Synthetic Three-and Lower-Dimensional Semiconductors Based on Inorganic Units", Molecular Crystals and Liquid Crystals Science and Technology, 1996, vol. 286, pp. 231-238.
Papavassiliou, George C., "Nanocrystalline/microcrystalline materials based on lead-halide units", Journal of Materials Chemistry, 2012, vol. 22, 8271-8280.
Schmidt et al., "Nontemplate Synthesis of CH3NH3PbBr3 Perovskite Nanoparticles", 2014, J. Am. Chem. Soc., 2014, 136 (3),pp. 850-853, Publication Date: Jan. 3, 2014.
Schmidt, L. C. et al., "Nontemplate Synthesis of CH3NH3PbBr3 Perovskite Nanoparticles", Journal of the American Chemical Society, 2014, vol. 136, No. 3, pp. 850-853 (Publication Dale: Jan. 3, 2014).
Schmidt, L. C. et al., "Nontemplate Synthesis of CH3NH3PbBr3 Perovskite Nanoparticles" Journal of the American Chemical Society, 2014, vol. 136. No. 3, with supplementary information, Jan. 3, 2014, 21 pages.
Smith, Andrew M. et al., "Semiconductor Nanocrystals: Structure, Properties, and Band Gap Engineering", Acc. Chem. Res. 2010, 43, 2, 190-200, Publication Date: Feb. 16, 2010.
Stoumpos, C. C. et al., "Crystal Growth of the Perovskite Semiconductor CsPbBr3: A New Material for High-Energy Radiation Detection", Crystal Growth & Design, 2013, vol. 13, No. 7, pp. 2722-2727.
Suzuki et al., "Optical Band Gap of Barium Titanate Nanoparticles Prepared by RF-plasma Chemical Vapor Deposition", 2005, Jap Journal of Applied Physics, vol. 44, No. 4A, pp. 2081-0282, published Apr. 8, 2005.
Urban, Jeffrey J. et al., "Synthesis of Single-Crystalline Perovskite Nanorods Composed of Barium Titanate and Strontium Titanate", J. Am. Chem. Soc. 2002, 124, 7,1186-1187, Publication Date:Jan. 29, 2002.
Miteri et al., "Quantum-chemical study of excitons in tetragonal BaTiO3 and SrTiO3 crystals", 2003, Proceedings of SPIE, vol. 5122, pp. 295-302, Feb. 2003.
WIPO, International Search Report of PCT/KR2015/011963 dated Mar. 10, 2016.
Written Opinion for PCT/KR2015/011957 dated Mar. 25, 2016.
Written Opinion for PCT/KR201 5/011958 dated Mar. 21, 2016.
Written Opinion for PCT/KR2015/011959 dated Mar. 14, 2016.
Written Opinion for PCT/KR2015/011963 dated Mar. 10, 2016.
Yu, Hui et al., "The Role of Chlorine in the Formation Process of CH3NH3PbI3-xClx' Perovskite", Advanced Functional Materials, Septembers, 2014, vol. 24, No. 45, pp. 7102-7108.

* cited by examiner (a)

(b)

110  110

CORE-SHELL STRUCTURED PEROVSKITE PARTICLE LIGHT-EMITTER, METHOD OF PREPARING THE SAME AND LIGHT EMITTING DEVICE USING THE SAME

TECHNICAL FIELD

The present invention relates to a light-emitter and a light emitting device using the same, and more particularly, to a core-shell structured perovskite or inorganic metal halide perovskite colloidal particle light-emitter, a method of preparing the same and a light emitting device using the same.

BACKGROUND ART

The major trend of the current display market is moving from an existing high-efficiency and high-resolution-oriented display to the emotional image-quality display having high color purity for demonstration of natural colors. From this viewpoint, while an organic light-emitter-based organic light emitting diode (OLED) has made great strides until now, alternatively, an inorganic quantum dot LED with improved color purity is being actively researched and developed. However, both of organic light-emitters and inorganic quantum dot light-emitters have intrinsic limitations because of their materials.

The existing organic light-emitters have high efficiency, but do not have high color purity because they exhibit a broad spectrum of emission. Although the inorganic colloidal quantum dot light-emitters have been known to have high color purity, since light emission is caused by a quantum size effect, it is difficult to control quantum dots to have a uniform size as they approach blue, and thus the color purity is degraded because of size distribution. Moreover, because inorganic quantum dots have a very deep valence band, a hole injection barrier is very high in an organic hole injection layer, and thus hole injection is difficult to perform. In addition, the prices of the two types of light-emitters are high. Therefore, there is a need for new-type organic/inorganic/hybrid light-emitters which can compensate for such disadvantages of the organic and inorganic light-emitters and sustain their advantages.

Hybrid materials composed of organics and inorganics have academically and industrially attracted attention because they have low production costs, simple preparation and device manufacturing processes, and easily adjustable optical and electrical properties, which are advantages of organic materials, and have high charge mobility and mechanical and thermal stabilities.

Among these, organic/inorganic/hybrid perovskites, hereafter "perovskites" have high color purity, facilitate color adjustment, and have low synthesis costs, and thus have enormous potential for development as light-emitters. The high color purity (full width at half maximum (FWHM)≈20 nm) is achieved because a layered structure can be formed by disposing the two dimensional (2D) plane of an inorganic material between the two-dimensional planes of organic materials, and due to a large difference in dielectric constant between the inorganic material and the organic material ($\varepsilon_{organic} \approx 2.4$, $\varepsilon_{inorganic} \approx 6.1$), electron-hole pairs (or excitons) are confined in the inorganic layer.

Materials having the conventional perovskite structure ($ABX_3$) are inorganic metal oxides.

Such inorganic metal oxides are substances, generally, oxides, in which cations of a metal (an alkali metal, an alkali earth metal, a transition metal or a lanthanide group) such as Ti, Sr, Ca, Cs, Ba, Y, Gd, La, Fe or Mn are located at either the A or B site, the cations having different sizes, and oxygen anions are located at the X site, and the metal cations at the B site are bound with the oxygen anions at the X site in corner-sharing octahedral 6-fold coordination. As an example of such an inorganic metal oxide, there is $SrFeO_3$, $LaMnO_3$, or $CaFeO_3$.

On the other hand, the halide perovskites have an $ABX_3$ structure, in which organic ammonium ($RNH_3$) cations are located at the A site, and halides (Cl, Br and I) are located at the X site, thereby forming a perovskite material. Therefore, the composition of the perovskite material is completely different from that of the inorganic metal oxides perovskite material.

In addition, characteristics of the material also vary according to the difference in composition. Since the inorganic metal oxide perovskites typically exhibit superconductivity, ferroelectricity, and colossal magnetoresistance, they have generally been applied to sensors, fuel cells, memory devices and the like and studied. For example, yttrium barium copper oxide has a superconducting or insulating property depending on oxygen content.

Meanwhile, the perovskites have a structure in which, for instance, an organic plane and an inorganic plane can be alternately laminated, which is similar to a lamella or layered structure, and therefore exciton trapping can occur in the inorganic plane. For this reason, such a perovskite can serve as an ideal light-emitter which emits light with very high color purity essentially because of its crystal structure, rather than its size.

When a perovskite includes organic ammonium cation as a central metal and chromophores (generally including a conjugated structure) with a band gap narrower than that of a halogen crystal structure ($BX_3$), since light emission occurs in the organic ammonium cation, high color-purity light cannot be emitted, and thus the FWHM of a light emission spectrum is widened to more than 50 nm, indicating that it is not suitable as a light emitting layer. For this reason, this case is not very suitable for a high color-purity light-emitter which is highlighted in the present invention. Accordingly, to prepare a high color-purity light-emitter, it is important that organic ammonium cation does not include a chromophore and light emission in an inorganic lattice composed of a central metal and halogen elements is allowed. In other words, the present invention is focusing on the development of a high color-purity and high efficiency light-emitter in which light emission occurs in an inorganic lattice. For example, in Korean Unexamined Patent Application No. 10-2001-0015084 (Feb. 26, 2001), an electroluminescent device using a dye-containing organic-inorganic-hybrid substance, formed in the form of a film, not particles, as a light emitting layer is disclosed, but in this device, light emission does not occur in a perovskite lattice structure but is originated from the emitting-dye itself. However, since the perovskite has low exciton binding energy, light emission can occur at a low temperature, but it has fundamental problem in which excitons cannot emit light due to thermal ionization and delocalization of charge carriers at room temperature, resulting in separation as free charges and annihilation. Moreover, when free charges are recombined to form excitons, light emission may not occur because the excitons are annihilated by a peripheral layer with high conductivity. Therefore, it is necessary to prevent quenching of excitons in order to increasing luminescence efficiency and luminance of a perovskite-based LED.

DISCLOSURE

Technical Problem

The present invention is directed to providing a particle light-emitter which is improved in luminescence efficiency and durability-stability by synthesizing a perovskite in a form of nanocrystal, rather than a film, in order to prevent thermal ionization, delocalization of charge carriers and quenching of excitons, and a light emitting device using the same.

The present invention is also directed to providing a particle light-emitter having improved luminescence efficiency and durability by forming a shell around a perovskite nanocrystal or inorganic metal halide perovskite nanocrystals to form a core-shell structure, and a light emitting device using the same.

Technical Solution

In one aspect, the present invention provides a core-shell structured perovskite nanocrystalline colloidal particle light-emitter. The core-shell structured perovskite nanocrystalline colloidal particle light-emitter is able to be dispersed in an organic solvent or an organics, and has a perovskite nanocrystal structure and a core-shell structured particle structure.

The organic solvent may be a polar or a non-polar solvent, and the polar solvent may be dimethylformamide, gamma butyrolactone, N-methylpyrrolidone, dimethylsulfoxide or isopropylalcohol, and the non-polar solvent may be dichloroethylene, trichloroethylene, chloroform, chlorobenzene, dichlorobenzene, styrene, xylene, toluene, or cyclohexene.

The perovskite nanocrystal may have a spherical, cylindrical, elliptic cylindrical, polygonal (or polyprism) cylindrical, two-dimensional (lamellar, plate) shape.

In the core-shell structured perovskite particle light-emitter, a perovskite nanocrystal size may be 1 nm to 900 nm.

Band gap energy of the perovskite particle is determined by the crystal structure, not by the particle size.

The core-shell structured perovskite particle may include a core including a first perovskite nanocrystal, and a shell which surrounds the core and includes a substance with a wider band gap than that of the first perovskite.

The first perovskite nanocrystal has a 2D or 3D structure.

The first perovskite has a structure of $ABX_3$, $A_2BX_4$, or $ABX_4$ or $A_{n-1}B_nX_{3n+1}$ (n is an integer of 2 to 6), in which A is an organic ammonium or metal substance, B is a metal or molecule substance, and X is a halogen element. A may be $(CH_3NH_3)_n$, $((C_xH_{2x+1})_nNH_2)$ $(CH_2NH_3)_n$, $R(NH_2)_2$, $(C_nH_{2n+1}NH_3)_n$, $(CF_3NH_3)$, $(CF_3NH_3)_n$, $((C_xF_{2x+1})_nNH_2)$ $(CF_2NH_3)_n$, $((C_xF_{2x+1})_nNH_3)_n$, $(C_nF_{2n+1}NH_3)_n$, metal, or a derivative thereof (R is alkyl or fluoroalkyl, n is an integer of 1 or higher, and x is an integer of 1 or higher), B may be a divalent transition metal, an organic molecule, a rare earth metal, an alkali earth metal, Pb, Sn, Ge, Ga, In, Al, Sb, Bi, Po or a combination thereof, and X may be Cl, Br, I or a combination thereof.

The shell may include a second organic-inorganic perovskite material. Alternatively, the shell may include a perovskite nanocrystal which is a second substance, other than a perovskite material.

The shell may include a semiconductor or insulating substance, a polymer substance or an organic small molecule substance.

The shell may include a substance having a broad energy band gap, compared to that of the perovskite substance present in the core.

The inorganic semiconductor substance or inorganic insulating substance may be an oxide semiconductor such as $TiO_x$ (x is a real number of 1 to 3), indium oxide ($In_2O_3$), tin oxide ($SnO_2$), zinc oxide (ZnO), zinc tin oxide, gallium oxide ($Ga_2O_3$), tungsten oxide ($WO_3$), aluminum oxide, titanium oxide, vanadium oxide ($V_2O_5$, $VO_2$, $V_4O_7$, $V_5O_9$ or $V_2O_3$), molybdenum oxide ($MoO_3$ or $MoO_x$), iron oxide, chromium oxide, bismuth oxide, indium-gallium zinc oxide (IGZO), $ZrO_2$, nickel oxide (NiO), copper (II) oxide (CuO), copper aluminum oxide (CAO, $CuAlO_2$) or zinc rhodium oxide (ZRO, $ZnRh_2O_4$); hydrogen sulfide ($H_2S$), cadmium sulfide (CdS), carbon disulfide ($CS_2$), lead sulfide (PbS), molybdenum disulfide ($MoS_2$), lithium fluoride (LiF), silver sulfide ($Ag_2S$), sodium sulfide ($Na_2S$), zinc sulfide (ZnS), mercury sulfide (HgS), arsenic sulfide (AsS), selenium sulfide ($SeS_2$), or iron disulfide ($FeS_2$).

The polymer substance may be a conjugated polymer, such as polyfluorene, poly(p-phenylene), poly(spirofluorene) or a derivative thereof; or a non-conjugated polymer, such as poly(methyl methacrylate) (PMMA), poly(N-vinylcarbazole) (PVK), polyethylene glycol, polyethylene oxide, polyphenylenesulfide ($C_6H_4S$), polyvinylpyrrolidone, polyethyleneimine or polyvinylalcohol (PVA) or derivative thereof. The polymer substance may be any one of all types of conjugated and non-conjugated polymers, and is not limited by a specific chemical or physical structure.

The organic small molecule substance may be a conjugated substance, such as 4,4'-bis(N-carbazolyl)-1,1''-biphenyl (CBP), 2,8-bis(diphenylphosphoryl)dibenzo[b,d]thiophene (PPT) or N,N-dicarbazolyl-3,5-benzene (mCP). The organic small molecule substance may be any one of all types of conjugated and non-conjugated small molecule substances, and is not limited by a specific chemical or physical structure.

In addition, the perovskite particle may further include a plurality of organic or inorganic ligands surrounding the shell. The organic ligand may include an alkyl halide. The alkyl structure of the alkyl halide may include an acyclic alkyl having a $C_nH_{2n+1}$ structure, a primary alcohol, a secondary alcohol, a tertiary alcohol, an alkylamide, a p-substituted aniline, a phenyl ammonium or fluorine ammonium.

In addition, a surfactant having a carboxylic acid (COOH), such as 4,4'-azobis(4-cyanovaleric acid), acetic acid, 5-aminosalicylic acid, acrylic acid, L-aspentic acid, 6-bromohexanoic acid, bromoacetic acid, dichloroacetic acid, ethylenediaminetetraacetic acid, isobutyric acid, itaconic acid, maleic acid, r-maleimidobutyric acid, L-malic acid, 4-nitrobenzoic acid, 1-pyrenecarboxylic acid or oleic acid may be included, but the present invention is not limited thereto.

In another aspect, the present invention provides a core-shell structured perovskite particle light-emitter. The core-shell structured perovskite particle light-emitter may be dispersed in an organic solvent or a polymer, and may have a perovskite nanocrystal structure and a core-shell structured particle structure.

In still another aspect, the present invention provides a solar cell. Such a solar cell may include a first electrode, a second electrode, and a photoactive layer disposed between the first electrode and the second electrode and including the above-described core-shell structured perovskite particle.

In addition, the core-shell structured perovskite particle may include a core including a first perovskite nanocrystal; and a shell which surrounds the core and has a substance having a wider band gap than that of the first perovskite.

In addition, the first perovskite has a structure of $ABX_3$, $A_2BX_4$, $ABX_4$ or $A_{n-1}B_nX_{3n+1}$ (n is an integer of 2 to 6), in which A is an alkali metal substance, B is a metal substance, and X is a halogen element.

In addition, A is Na, K, Rb, Cs or Fr.

A plurality of organic ligands or inorganic ligands surrounding the shell may be further included.

In yet another aspect, the present invention provides a method of preparing a core-shell structured perovskite particle light-emitter. The method of preparing a core-shell structured perovskite particle light-emitter may include preparing a first solution by dissolving first perovskite in a polar solvent and a second solution by dissolving a surfactant in a non-polar solvent; forming a core including a first perovskite nanocrystal by mixing the first solution with the second solution; and forming a shell surrounding the core and including a second perovskite nanocrystal, an inorganic semiconductor substance or inorganic insulating substance by adding a third solution in which a second perovskite, inorganic semiconductor substance or inorganic insulating substance having a wider band gap than that of the first perovskite is dissolved to the second solution.

In yet another aspect, the present invention provides a method of preparing a core-shell structured perovskite particle light-emitter. The method of preparing a core-shell structured perovskite particle light-emitter may include preparing a first solution by dissolving a first perovskite in a polar solvent and a second solution by dissolving a surfactant in a non-polar solvent; forming a core including a first perovskite nanocrystal by mixing the first solution with the second solution; and forming a shell surrounding the cores and having a wider band gap than that of the core, by adding an organic ammonium halide solution to the second solution and then stirring the resulting solution.

In yet another aspect, the present invention provides a method of preparing a core-shell structured perovskite particle light-emitter. The method of preparing a core-shell structured perovskite particle light-emitter may include preparing a first solution by dissolving a first perovskite in a polar solvent and a second solution by dissolving a surfactant in a non-polar solvent; forming a core including a first perovskite nanocrystal by mixing the first solution with the second solution; thermally decomposing a surface of the core by thermally treating the second solution; and forming a shell, which surrounds the core and has a wider band gap than that of the core, by adding an organic ammonium halide solution to the thermally-treated second solution.

In yet another aspect, the present invention provides a light emitting device. Such a light emitting device may include a first electrode; a second electrode; and a light emitting layer which is disposed between the first electrode and the second electrode and includes the above-described core-shell structured perovskite particle light-emitter or core-shell structured inorganic metal halide perovskite particle light-emitter.

Advantageous Effects

A crystalline colloidal particle light-emitter including an organic/inorganic/hybrid perovskite nanocrystal or inorganic metal halide perovskite nanocrystal according to the present invention can form a perovskite or inorganic metal halide perovskite, which has a crystalline structure of a combination of FCC and BCC in the particle light-emitter, can form a lamella (or layered) structure in which an organic plane and an inorganic plane are alternately laminated, and can exhibit high color purity by trapping excitons in the inorganic plane.

In addition, exciton annihilation caused by thermal ionization and delocalization of charge carriers can be prevented by a decrease in exciton diffusion length and an increase in exciton binding energy in the nanocrystals with a size of 900 nm or less, resulting in high luminescence efficiency at room temperature.

In addition, the band gap energy of the perovskite particle is determined by the perovskite crystal structure, unlike the inorganic quantum dot light-emitter depending on a particle size.

In addition, compared to a 3D perovskite, a 2D perovskite is synthesized as a nanocrystal, thereby further improving luminescence efficiency due to the increase in exciton binding energy and increasing durability-stability.

Moreover, in the core-shell structured perovskite particle light-emitter formed according to the present invention, a shell is formed of a substance having a wide band gap than that of the core to allow excitons to be more strongly confined in the core, and to prevent exposure of the core perovskite in the air using stable perovskite or inorganic semiconductor or insulating substance in the air or a polymer, resulting in improvement in the durability of the nanocrystal.

The technical effects of the present invention are not limited as described above, and other technical effects that have not been described will be clearly understood to those of ordinary skill in the art from descriptions as below.

MODES OF THE INVENTION

Hereinafter, examples of the present invention will be described in detail with reference to the accompanying drawings as below.

The present invention may have various modifications and alternative forms, and specific examples will be illustrated in detail with reference to the accompanying drawings below. However, the present invention is not limited to the particular forms disclosed herein, and rather includes all of modifications, equivalents and substitutions consistent with the spirit of the present invention defined by the claims.

When an element such as a layer, region or substrate is referred to as being present "on" another element, it will be understood that the element may be directly present on another element, or a third element may be present therebetween.

Although the terms "first," "second," etc. may be used to describe various elements, components, regions, layers and/or areas, it is to be understood that such elements, components, regions, layers and/or areas should not be limited by these terms.

A perovskite particle according to an exemplary embodiment of the present invention will be described.

The perovskite particle according to an exemplary embodiment of the present invention may be dispersed in an organic solvent or organic materials and include a perovskite nanocrystal structure.

Figure 1:
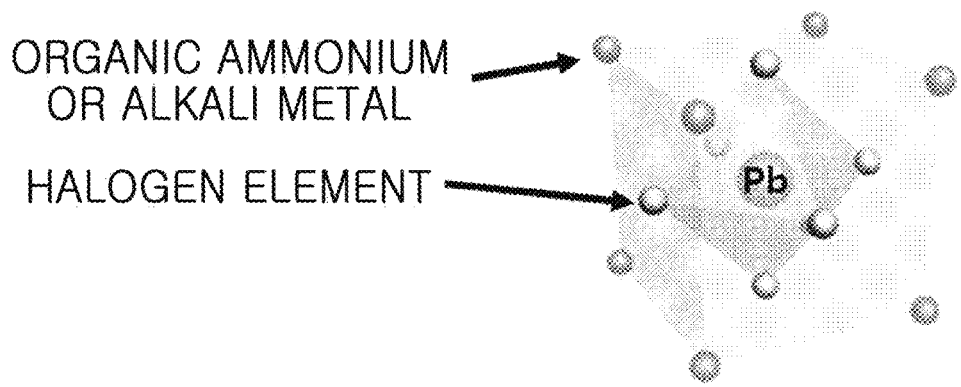
FIG. 1 is a schematic diagram of a perovskite nanocrystal structure according to an exemplary embodiment of the present invention.

FIG. 1 shows a perovskite nanocrystal structure according to an exemplary embodiment of the present invention.

FIG. 1 shows structures of both of perovskite nanocrystals and inorganic metal halide perovskite nanocrystals.

Referring to FIG. 1, the perovskite nanocrystal includes a central metal or molecule located in the middle, and has a face centered cubic (FCC) structure in which six inorganic halide substances (X) are located on all hexahedral sides and a body centered cubic (BCC) structure in which eight organic ammonium (OA) elements are located at all hexahedral vertices. As an example, the central metal used herein is Pb.

In addition, the inorganic metal halide perovskite nanocrystal includes a central metal located in the middle, and has an FCC structure in which six inorganic halide substances (X) are located on all hexahedral sides and a BCC structure in which eight alkali metal elements are located at all hexahedral vertices. As an example, the central metal used herein is Pb.

Here, the structures include a cubic structure in which all hexahedral sides make an angle of 90 degrees with each other, and the width, the length and the height are the same as each other, and a tetragonal structure in which the width and the length are the same as each other, but the height is different from the others.

Accordingly, a 2D structure according to the present invention is a perovskite nanocrystal structure, which includes a central metal or molecule in the middle, and has a FCC in which six inorganic halide substances are located on all hexahedral sides and a BCC in which eight organic ammonium elements are located at all hexahedral vertices, and is defined as a structure in which the width and the length are the same as each other, but the height is 1.5-fold longer than the width and the length.

A method of preparing a core-shell structured perovskite particle light-emitter according to an exemplary embodiment of the present invention will be described.

Figure 2:
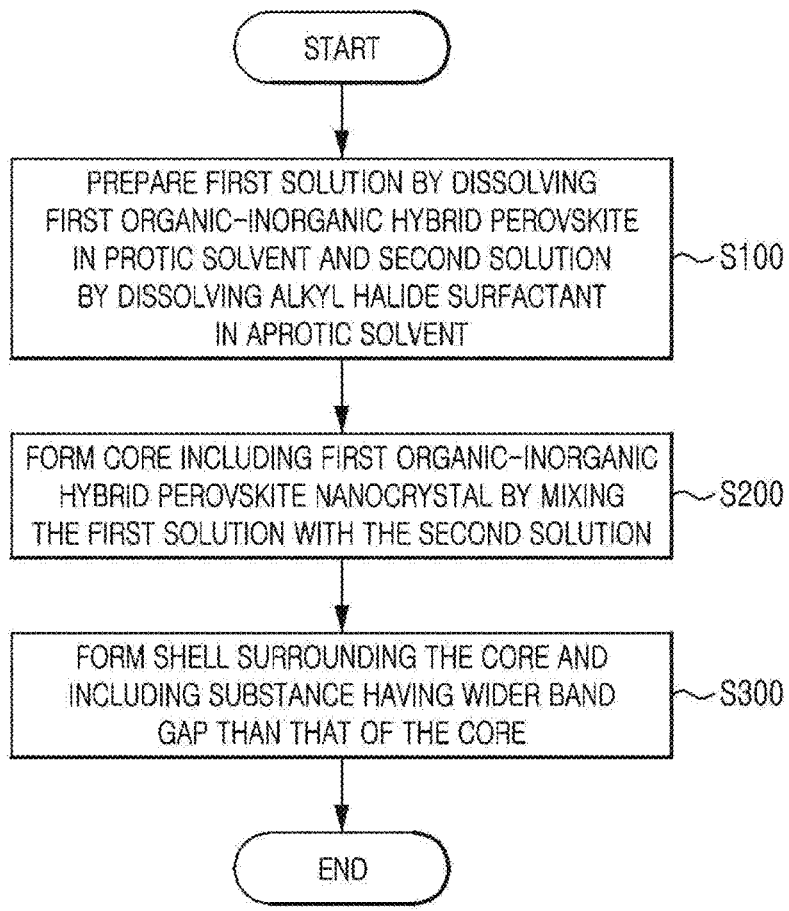
FIG. 2 is a flowchart illustrating a method of preparing a core-shell structured perovskite particle light-emitter according to an exemplary embodiment of the present invention.

FIG. 2 is a flowchart illustrating a method of preparing a core-shell structured perovskite nanocrystalline colloidal particle light-emitter according to an exemplary embodiment of the present invention.

Referring to FIG. 2, the method of preparing a core-shell structured perovskite particle light-emitter according to the present invention includes preparing a first solution by dissolving a first perovskite in a polar solvent and a second solution by dissolving a surfactant in a non-polar solvent (S100), forming a core including a first perovskite nanocrystal by mixing the first solution with the second solution (S200) and forming a shell surrounding the core and including a substance having a wider band gap than that of the core (S300).

In further detail, first, a first solution in which a first perovskite is dissolved in a polar solvent and a second solution in which a surfactant is dissolved in a non-polar solvent are prepared (S100).

Here, the polar solvent may be dimethylformamide, gamma butyrolactone, N-methylpyrrolidone, or dimethylsulfoxide, or iso-propyl alcohol but the present invention is not limited thereto.

Here, the first perovskite nanocrystal has a 2D or 3D structure.

For example, the perovskite having a 3D crystalline structure may be an $ABX_3$ structure. In addition, the perovskite having a 2D crystalline structure may be an $ABX_3$, $A_2BX_4$, $ABX_4$ or $A_{n-1}B_nX_{3n+1}$ (n is an integer of 2 to 6) structure.

Here, A is an organic ammonium substance, B is a metal substance, and X is a halogen element.

For example, A may be $(CH_3NH_3)_n$, $((C_xH_{2x+1})_nNH_2)(CH_2NH_3)_n$, $R(NH_2)_2$, $(C_nH_{2n+1}NH_3)_n$, $(CF_3NH_3)$, $(CF_3NH_3)_n$, $((C_xF_{2x+1})_nNH_2)_n$, $(CF_2NH_3)_n$, $((C_xF_{2x+1})_nNH_3)_n$, $(C_nF_{2n+1}NH_3)_n$, metal, or a derivative thereof (here n is an integer of 1 or higher, R is alkyl or fluoroalkyl, and x is an integer of 1 or higher), B may be a divalent transition metal, an organic molecule, a rare earth metal, an alkali earth metal, Pb, Sn, Ge, Ga, In, Al, Sb, Bi, Po or a combination thereof, and X may be Cl, Br, I or a combination thereof. Here, the rare earth metal may be, for example, Ge, Sn, Pb, Eu or Yb. In addition, the alkali earth metal may be, for example, Ca or Sr.

Meanwhile, such a perovskite may be prepared by combining AX and $BX_2$ in a certain ratio. That is, the first solution may be prepared by dissolving AX and $BX_2$ in a polar solvent at a certain ratio. For example, a first solution may be prepared in which an $A_2BX_4$ perovskite is dissolved by dissolving AX and $BX_2$ in a polar solvent at a ratio of 2:1.

In addition, the perovskite more preferably employs a substance having a 2D crystalline structure, rather than a 3D crystalline structure.

This is because, when the perovskite having a 2D structure, relative to that having a 3D structure, is prepared as a nanocrystal, excitons may be more dominantly confined to an inorganic plane by an organic plane due to a clear distinction between the inorganic plane and the organic plane, which are laminated, thereby increasing exciton binding energy, improving luminescence efficiency, increasing durability-stability, and exhibiting higher color purity.

In addition, the non-polar solvent may be dichloroethylene, trichloroethylene, chloroform, chlorobenzene, dichlorobenzene, styrene, xylene, toluene, or cyclohexene, but the present invention is not limited thereto.

In addition, the surfactant may be an alkyl halide surfactant having an alkyl-X structure. Here, a halogen element corresponding to X may be Cl, Br or I. In addition, as the alkyl moiety, an acyclic alkyl having a $C_nH_{2n+1}$ structure, a primary alcohol having, for example, a $C_nH_{2n+1}OH$ structure, a secondary alcohol, a tertiary alcohol, an alkyl amine having an alkyl-N structure (e.g., hexadecyl amine, 9-octadecenylamine 1-amino-9-octadecene ($C_{19}H_{37}N$)), p-substituted aniline, phenyl ammonium or fluorine ammonium may be employed, but the present invention is not limited thereto.

In addition, the surfactant may contain a carboxylic acid (COOH), such as 4,4'-azobis(4-cyanovaleric acid), acetic acid, 5-aminosalicylic acid, acrylic acid, L-aspentic acid, 6-bromohexanoic acid, bromoacetic acid, dichloroacetic acid, ethylenediaminetetraacetic acid, isobutyric acid, itaconic acid, maleic acid, r-maleimidobutyric acid, L-malic acid, 4-nitrobenzoic acid, 1-pyrenecarboxylic acid or oleic acid, but the present invention is not limited thereto.

Next, the first solution is mixed with the second solution, thereby forming a core including a first perovskite nanocrystal (S200).

The formation of a core by mixing the first solution with the second solution is preferably carried out by adding the first solution to the second solution dropwise. In addition, the second solution may be subjected to stirring. For example, a first solution in which a perovskite is dissolved may be slowly added dropwise to the second solution in which an alkyl halide surfactant is dissolved while harshly stirring, thereby synthesizing the core including a first perovskite nanocrystal.

In this case, when the first solution is dropped and mixed into the second solution, due to a difference in solubility, the perovskite is precipitated from the second solution. In addition, as a surface of the perovskite precipitated from the second solution is stabilized by the alkyl halide surfactant, a uniformly-dispersed perovskite nanocrystal core is generated. Therefore, in this case, the generated perovskite nanocrystal is surrounded by a plurality of alkyl halide organic ligands or inorganic ligands.

Meanwhile, a size of the perovskite nanocrystal may be controlled by adjustment of a length or shape factor of the alkyl halide surfactant. For example, the shape factor adjustment may facilitate size control by a linear, tapered or inversed triangular surfactant.

In addition, such a perovskite nanocrystal may have a size of 1 nm to 900 nm. Meanwhile, the particle size refers to a size not allowing for the length of a ligand which will be described below, that is, a size of the particle excluding such a ligand.

If the size of the perovskite particle exceeds 900 nm, there may be a fundamental problem in which excitons are not emitted but separated into free charges due to thermal ionization and delocalization of charge carriers in such a large nanocrystal, resulting in annihilation.

Subsequently, a shell surrounding the core and including a substance having a wider band gap than that of the core is formed (S300).

For example, the shell may include a second perovskite material. Alternatively, the shell may include an inorganic semiconductor or a polymer substance.

For example, a solution in which a second perovskite, an inorganic semiconductor substance or insulating substance, a polymer substance or an organic small molecule substance, which has a wider band gap than that of the first perovskite, is dissolved is added to the second solution, thereby forming a shell surrounding the core, which includes a second perovskite nanocrystal, an inorganic semiconductor substance, insulating substance, a polymer substance or an organic small molecule substance.

The second perovskite preferably employs a substance having a wider band gap than that of the first perovskite. Such a second perovskite may have an $ABX_3$, $A_2BX_4$, $ABX_4$ or $A_{n-1}B_nX_{3n+1}$ (n is an integer of 2 to 6) structure. Here, A is an organic ammonium substance or metal, B is a metal or molecule substance, and X is a halogen element.

For example, A may be $(CH_3NH_3)_n$, $((C_xH_{2x+1})_nNH_2)$ $(CH_2NH_3)_n$, $R(NH_2)_2$, $(CH_{2n+1}NH_3)_n$, $(CF_3NH_3)$, $(CF_3NH_3)_n$, $((C_xF_{2x+1})_nNH_2)(CF_2NH_3)_n$, $((C_xF_{2x+1})_nNH_3)_n$, $(C_nF_{2n+1}NH_3)_n$, metal, or a derivative thereof (R is alkyl or fluoroalkyl, n is an integer of 1 or higher, and x is an integer of 1 or higher), B may be a divalent transition metal, a molecule, rare earth metal, alkali earth metal, Pb, Sn, Ge, Ga, In, Al, Sb, Bi, Po or a combination thereof, and X may be Cl, Br, I or a combination thereof. The rare earth metal may be, for example, Ge, Sn, Pb, Eu or Yb. Also, the alkali earth metal may be, for example, Ca or Sr.

The inorganic semiconductor substance or inorganic insulating substance may be an oxide semiconductor such as TiO (x is a real number of 1 to 3), indium oxide ($In_2O_3$), tin oxide ($SnO_2$), zinc oxide (ZnO), zinc tin oxide, gallium oxide ($Ga_2O_3$), tungsten oxide ($WO_3$), aluminum oxide, titanium oxide, vanadium oxide ($V_2O_5$, $VO_2$, $V_4O_7$, $V_5O_9$ or $V_2O_3$), molybdenum oxide ($MoO_3$ or MoOX), iron oxide, chromium oxide, bismuth oxide, indium-gallium zinc oxide (IGZO), $ZrO_2$, nickel oxide (NiO), copper (II) oxide (CuO), copper aluminum oxide (CAO, $CuAlO_2$) or zinc rhodium oxide (ZRO, $ZnRh_2O_4$).

Alternatively, the inorganic semiconductor substance or inorganic insulating substance may be, for example, hydrogen sulfide ($H_2S$), cadmium sulfide (CdS), carbon disulfide ($CS_2$), lithium fluoride (LiF), lead sulfide (PbS), molybdenum disulfide ($MoS_2$), silver sulfide ($Ag_2S$), sodium sulfide ($Na_2S$), zinc sulfide (ZnS), mercury sulfide (HgS), arsenic sulfide (AsS), selenium sulfide ($SeS_2$), or iron disulfide ($FeS_2$).

The polymer substance may be a conjugated polymer, such as polyfluorene, poly(p-phenylene), poly(spirofluorene) or a derivative thereof; or a non-conjugated polymer, such as poly(methyl methacrylate) (PMMA), poly(N-vinylcarbazole) (PVK), polyethylene glycol, polyethylene oxide, polyvinylpyrrolidone, polyphenylenesulfide ($C_6H_4S$), polyethyleneimine or polyvinylalcohol (PVA). The polymer substance may be any one of all types of conjugated and non-conjugated polymers, and is not limited by a specific chemical structure.

The organic small molecule substance may be a conjugated substance, such as 4,4'-bis(N-carbazolyl)-1,1'''-biphenyl (CBP), 2,8-bis(diphenylphosphoryl)dibenzo[b,d]thiophene (PPT) or N,N-dicarbazolyl-3,5-benzene (mCP). The organic small molecule substance may be any one of all types of conjugated and non-conjugated small molecule substances, and is not limited by a specific chemical structure.

Figure 3:
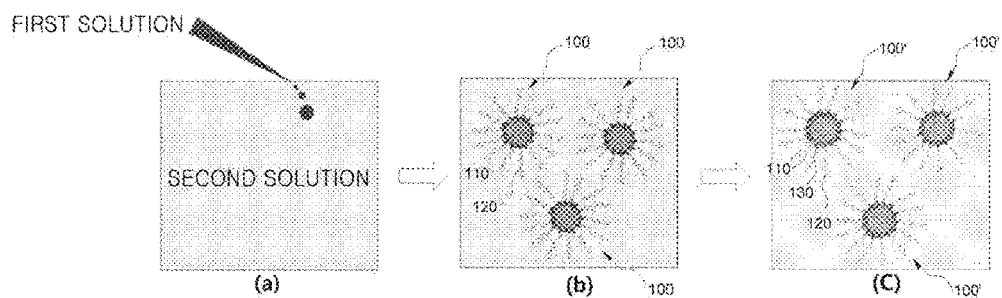
FIG. 3 is a schematic diagram illustrating a method of preparing a core-shell structured perovskite particle light-emitter according to an exemplary embodiment of the present invention.

FIG. 3 is a schematic diagram illustrating a method of preparing a core-shell structured perovskite particle light-emitter according to an exemplary embodiment of the present invention.

Referring to FIG. 3(A), a first solution in which a perovskite is dissolved in a polar solvent is added dropwise to a second solution in which an alkyl halide surfactant is dissolved in non-polar solvent.

Referring to FIG. 3(B), when the first solution is added to the second solution, due to a difference in solubility, the perovskite is precipitated from the second solution, and as the precipitated perovskite is stabilized while being surrounded by the alkyl halide surfactant, a perovskite particle light-emitter 100 including a uniformly-dispersed perovskite nanocrystal core 110 is generated. The nanocrystal core 110 is surrounded by alkyl halide organic ligands.

Meanwhile, the perovskite particle light-emitter composed of the core according to an exemplary embodiment of the present invention will be described first with reference to FIG. 4.

Figure 4:
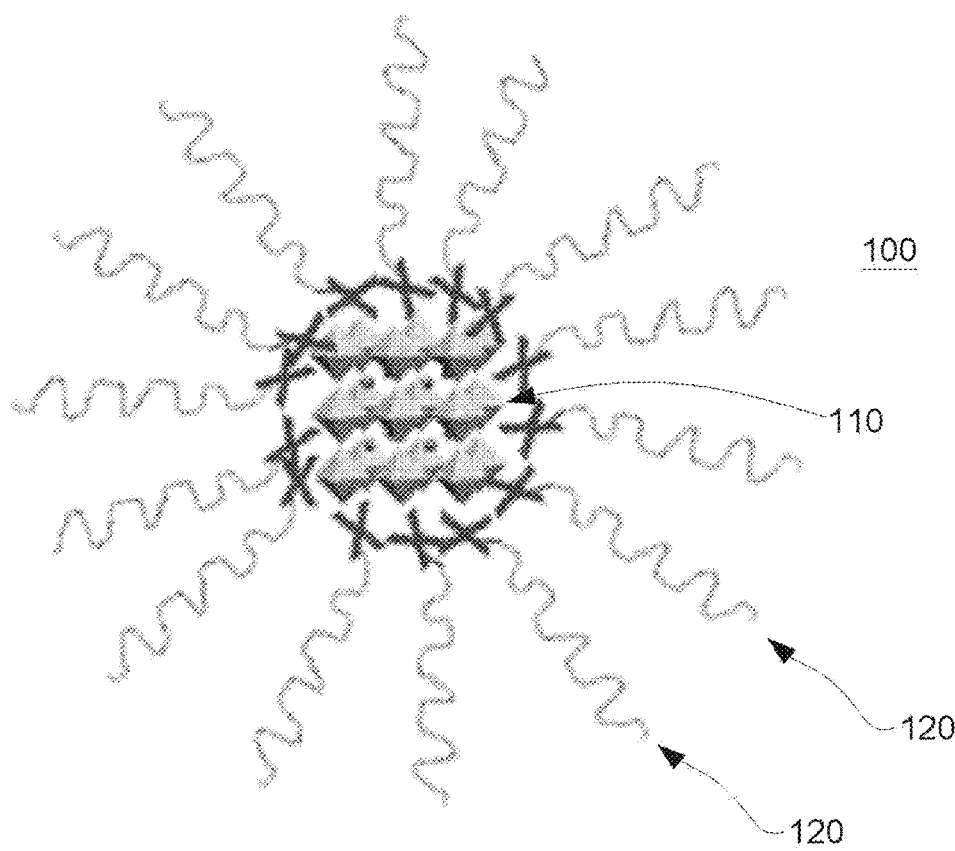
FIG. 4 is a schematic diagram of a perovskite particle light-emitter and an inorganic metal halide perovskite particle light-emitter according to an exemplary embodiment of the present invention.

FIG. 4 is a schematic diagram of a perovskite particle light-emitter and an inorganic metal halide perovskite particle light-emitter according to an exemplary embodiment of the present invention. Here, FIG. 4 illustrates the perovskite particle light-emitter, and when the perovskite of FIG. 4 is changed to an inorganic metal halide perovskite, an inorganic metal halide particle light-emitter is generated, and a description thereof is the same as described above.

Referring to FIG. 4, the light-emitter according to an exemplary embodiment of the present invention, as a perovskite particle light-emitter or an inorganic metal halide perovskite particle light-emitter, includes a perovskite nanocrystal structure or inorganic metal halide perovskite nanocrystal structure 110, which can be dispersed in an organic solvent or a polymer. Such a nanocrystal structure 110 serves as a nanocrystal core of the light-emitter according to the present invention.

In addition, the perovskite or inorganic metal halide perovskite may be a substance having a 3D crystalline structure or a 2D crystalline structure.

For example, a perovskite having a 3D crystalline structure may have an $ABX_3$ structure. In addition, a perovskite having a 2D crystalline structure may have an $ABX_3$, $A_2BX_4$, $ABX_4$ or $A_{n-1}B_nX_{3n+1}$ (n is an integer of 2 to 6) structure.

Here, A may be $(CH_3NH_3)_n$, $((C_xH_{2x+1})_nNH_2)(CH_2NH_3)_n$, $R(NH_2)_2$, $(C_nH_{2n+1}NH_3)_n$, $(CF_3NH_3)$, $(CF_3NH_3)_n$, $((C_xF_{2x+1})_nNH_2)(CF_2NH_3)_n$, $((C_xF_{2x+1})_nNH_3)_n$, $(C_nF_{2n+1}NH_3)_n$, metal, or a derivative thereof (R is alkyl or fluoroalkyl, n is an integer of 1 or higher), B may be a divalent transition metal, a molecule, a rare earth metal, an alkali earth metal, Pb, Sn, Ge, Ga, In, Al, Sb, Bi, Po or a combination thereof, and X may be Cl, Br, I or a combination thereof. The rare earth metal may be, for example, Ge, Sn, Pb, Eu or Yb. Also, the alkali earth metal may be, for example, Ca or Sr.

For example, an inorganic metal halide perovskite having a 3D crystalline structure may have an $ABX_3$ structure. In addition, an inorganic metal halide perovskite having a 2D crystalline structure may have an $ABX_3$, $A_2BX_4$, $ABX_4$ or $A_{n-1}B_nX_{3n+1}$ (n is an integer of 2 to 6) structure.

Here, A may be an alkali metal, B may be a divalent transition metal, a rare earth metal, an alkali earth metal, Pb, Sn, Ge, Ga, In, Al, Sb, Bi, Po or a combination thereof, and X may be Cl, Br, I or a combination thereof. The rare earth metal may be, for example, Ge, Sn, Pb, Eu or Yb. Also, the alkali earth metal may be, for example, Ca or Sr.

Meanwhile, the perovskite particle light-emitter 100 according to the present invention may further include a plurality of organic ligands or inorganic ligands 120 which surround the above-described perovskite nanocrystal core 110.

Such an organic ligand 120 may include an alkyl halide, polymers, organic small molecules, inorganic ligands. For example, the alkyl halide may have an alkyl-X structure. A halogen element corresponding to X may be Cl, Br or I. In addition, as the alkyl moiety, an acyclic alkyl having a $C_nH_{2n+1}$ structure, a primary alcohol having, for example, a $CH_{2n+1}OH$ structure, a secondary alcohol, a tertiary alcohol, an alkylamine having an alkyl-N structure (ex. hexadecyl amine, 9-octadecenylamine 1-amino-9-octadecene ($C_{19}H_{37}N$)), p-substituted aniline, phenyl ammonium or fluorine ammonium may be employed, but the present invention is not limited thereto.

Referring to FIG. 3(C) again, a shell 130 surrounding the core 110 and including a substance having a wider band gap than that of the core 110 may be formed.

Meanwhile, a core-shell structure according to an exemplary embodiment of the present invention will be described first with reference to FIG. 5.

The core-shell structured perovskite particle light-emitter according to an exemplary embodiment of the present invention is able to be dispersed in an organic solvent or organic material, and has a perovskite nanocrystal structure and a core-shell structured particle structure. The organic solvent may be a polar solvent or a non-polar solvent.

In addition, the nanocrystal may be formed in a spherical, cylindrical, elliptic cylindrical, polygonal cylindrical, or two-dimensional (plate) shape.

In addition, the size of such a nanocrystal may be 1 nm to 900 nm. Meanwhile, the particle size refers to a size not allowing for the length of a ligand which will be described below, that is, a size of the particle excluding such a ligand. For example, when the nanocrystal has a spherical shape, it may have a diameter of 1 nm to 900 nm.

In addition, a plurality of organic ligands or inorganic ligands which surround such a perovskite nanocrystal may be further included.

Figure 5:
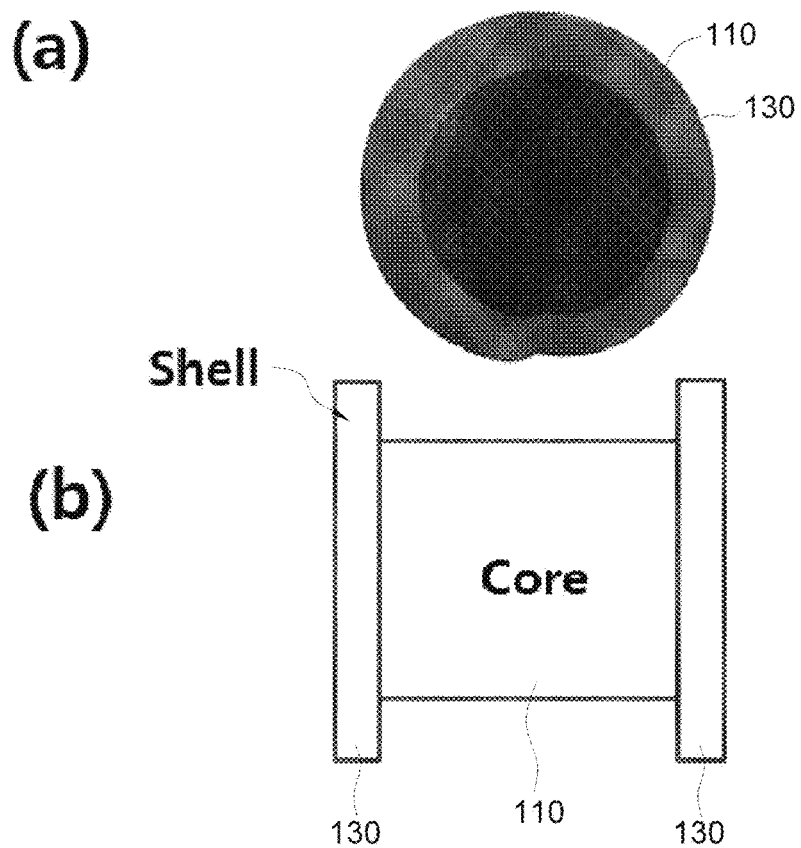
FIG. 5 shows a schematic diagram of a partial section of a core-shell structured perovskite nanocrystal according to an exemplary embodiment of the present invention and a band diagram thereof.

FIG. 5 shows a schematic diagram of a core-shell structured perovskite nanocrystal according to an exemplary embodiment of the present invention and a band diagram thereof.

Referring to FIG. 5(A), it can be seen that a particle light-emitter according to the present invention has a structure including a core 110 and a shell 130 surrounding the core 110. Here, referring to FIG. 5(B), since the energy band gap of the shell is higher than that of the core, excitons may be more strongly confined to the core perovskite.

Again, methods of forming such a shell will be described in detail with reference to FIG. 6.

Figure 6:
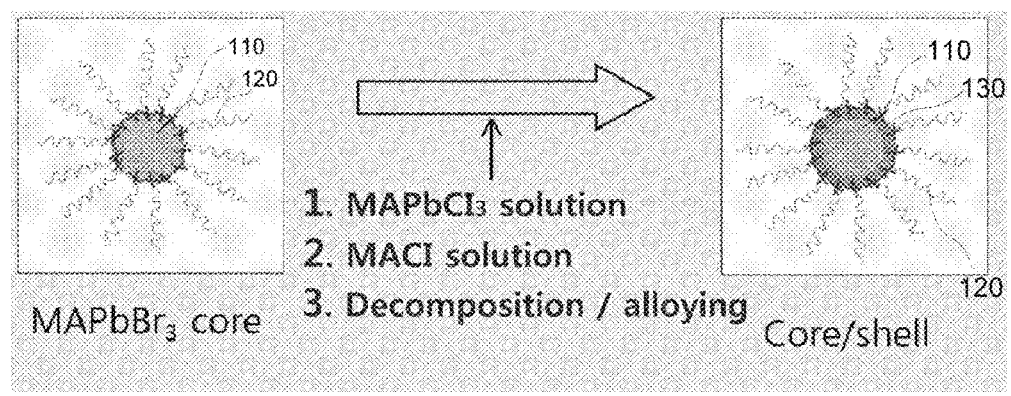
FIG. 6 is a schematic diagram illustrating a method of forming a shell according to an exemplary embodiment of the present invention.

FIG. 6 is a schematic diagram illustrating a method of forming a shell according to an exemplary embodiment of the present invention.

Referring to FIG. 6, first, a first perovskite nanocrystal 120 is formed as a core. Here, as the first perovskite, $MAPbBr_3$ may be exemplified. Here, MA refers to methylammonium.

A method of forming such a core may be performed by inverse nano-emulsion. For example, the method of forming a core may include preparing a first solution in which a first perovskite is dissolved in a polar solvent and a second solution in which an alkyl halide surfactant is dissolved in a non-polar solvent, and forming a core including a first perovskite nanocrystal by mixing the first solution with the second solution.

Then, as a method of forming a shell on a surface of such a core, three methods as follows may be used.

As a first method, a shell may be formed using a second perovskite solution or an inorganic semiconductor solution. That is, a shell including a second perovskite nanocrystal or an inorganic semiconductor substance, which surrounds the core, may be formed by adding a third solution in which a second perovskite, inorganic semiconductor substance or inorganic insulating substance having a wider band gap than that of the first perovskite is dissolved to the second solution.

For example, while the perovskite ($MAPbBr_3$) solution prepared by the above-described method (inverse nano-emulsion) is harshly stirred, a shell including a second perovskite nanocrystal ($MAPbCl_3$), an inorganic semiconductor substance or inorganic insulating substance may be formed by slowly adding a perovskite ($MAPbCl_3$) solution having a wider band gap than that of $MAPbBr_3$ or an inorganic semiconductor solution containing, for example, ZnS, PbS, PbSe, ZnSe or a metal oxide dropwise.

This is because the core perovskite is mixed with the shell perovskite, thereby forming an alloy form or exhibiting stickiness, and thus a core-shell structured perovskite may be synthesized.

As a result, a $MAPbBr_3/MAPbCl_3$ core-shell structured perovskite particle light-emitter may be formed.

As a second method, a shell may be formed using an organic ammonium halide solution. That is, a large amount of the organic ammonium halide solution may be added to the second solution and then stirred, thereby forming a shell having a wider band gap than that of the core and surrounding the core.

For example, as a MACl solution may be added to the perovskite ($MAPbBr_3$) solution prepared by the above-described method (inverse nano-emulsion or reprecipitation) and then harshly stirred, $MAPbBr_3$ on the surface is converted into $MAPbBr_{3-x}Cl_x$ because of excessive MACl, thereby forming a shell.

As a result, a $MAPbBr_3/MAPbBr_{3-x}Cl_x$ core-shell structured perovskite particle light-emitter may be formed.

As a third method, a shell may be formed using thermal decomposition/alloying. That is, after the second solution may be thermally treated to thermally decompose a core surface, a shell having a wider band gap than that of the core, which surrounds the core, may be formed by alloying a surface again by adding an organic ammonium halide solution to the thermally-treated second solution.

For example, after a perovskite ($MAPbBr_3$) solution prepared by the above-described method (inverse nano-emulsion or hot injection) is thermally treated to thermally decompose such that the surface is changed into $PbBr_2$, a shell may be formed by alloying the surface into $MAPbBr_2Cl$ again by adding a MACl solution.

That is, $MAPbBr_3$ may be thermally decomposed into MABr and $PbBr_2$ through thermal decomposition.

As a result, a $MAPbBr_3/MAPbBr_2Cl$ core-shell structured perovskite particle light-emitter may be formed.

As a fourth method, a shell may be formed using an organic semiconductor solution. That is, a shell including a core including the first perovskite nanocrystal and an organic semiconductor substance surrounding the core may be formed by previously dissolving an organic semiconductor substance having a wider band gap than that of the perovskite in a second solution, and adding the first solution in which the above-described first perovskite is dissolved in the second solution.

Since the organic semiconductor substance tends to be attached to the core perovskite surface, a core-shell structured perovskite may be synthesized.

As a result, a $MAPbBr_3$-organic semiconductor core-shell structured perovskite particle light-emitter may be formed.

As a fifth method, a shell may be formed using selective extraction. That is, a shell having a wider band gap than that of the core, which surrounds the core, may be formed by forming its surface only with $PbBr_2$ by selectively extracting MABr from a nanocrystal surface by adding a small amount of IPA solvent to a second solution in which a core including the first perovskite nanocrystal is formed.

For example, a $PbBr_2$ shell may be formed by selectively dissolving and extracting only MABr on the nanocrystal surface to remain only $PbBr_2$ thereon by adding a small amount of IPA to the perovskite ($MAPbBr_3$) solution prepared by the above-described method (inverse nano-emulsion).

That is, the MABr on the $MAPbBr_3$ surface may be removed through the selective extraction.

As a result, a $MAPbBr_3$—$PbBr_2$ core-shell structured perovskite particle light-emitter may be formed.

A core-shell structured inorganic metal halide perovskite particle light-emitter according to an exemplary embodiment of the present invention will be described.

The core-shell structured inorganic metal halide perovskite particle light-emitter may be dispersed in an organic solvent, and include a perovskite nanocrystal structure and a core-shell structured particle structure.

Such an inorganic metal halide perovskite particle light-emitter is the same as the above-described perovskite particle light-emitter, except that the organic ammonium substance at the A site is replaced with an alkali metal substance. Here, in the alkali metal substance, for example, A may be Na, K, Rb, Cs or Fr.

For example, the core-shell structured inorganic metal halide perovskite particle may include a core including a first inorganic metal halide perovskite nanocrystal and a shell surrounding the core and including a substance having a wider band gap than that of the first inorganic metal halide perovskite. In addition, the first inorganic metal halide perovskite may include an $ABX_3$, $A_2BX_4$, $ABX_4$ or $A_{n-1}B_nX_{3n+1}$ (n is an integer of 2 to 6) structure, in which A may be an alkali metal substance, B may be a metal substance, and X may be a halogen element. The core-shell structured inorganic metal halide perovskite particle may further include a plurality of organic ligands or inorganic ligands surrounding the shell. In addition, the shell may include a second inorganic halide, an inorganic metal halide perovskite nanocrystal substance, an inorganic semiconductor, insulating substance, or a polymer substance.

Such a core-shell structured "inorganic metal halide" perovskite particle has an alkali metal as an A site substance, and a core-shell structured perovskite particle is the same as the above one except that an A site substance is an organic ammonium substance. Therefore, details on the core-shell structured inorganic metal halide perovskite particle and the method of preparing the same will be omitted below to avoid overlapping because these are the same as described in the details on the core-shell structured perovskite particle and the method of preparing the same, which have been already explained.

A light emitting device according to an exemplary embodiment of the present invention will be described.

The light emitting device according to an exemplary embodiment of the present invention may be a device using a light emitting layer including the above-described core-shell structured perovskite particle light-emitter or core-shell structured inorganic metal halide perovskite particle light-emitter. The core-shell structured perovskite particle light-emitter or inorganic metal halide perovskite particle light-emitter may be prepared by the method described above.

For example, the light emitting device according to the present invention may include a first electrode, a second electrode, and a light emitting layer which is disposed between the first electrode and the second electrode, and includes the above-described core-shell structured perovskite particle light-emitter or inorganic metal halide perovskite particle light-emitter.

As another example, a photoactive layer including the above-described core-shell structured perovskite particle or core-shell structured inorganic metal halide perovskite particle may be applied to a solar cell. Such a solar cell may include a first electrode, a second electrode, and a photoactive layer which is disposed between the first electrode and the second electrode and includes the above-described perovskite particle.

Preparation Example 1

A perovskite nanocrystalline colloidal particle light-emitter having a 3D structure according to an exemplary embodiment of the present invention was formed. The perovskite particle light-emitter was formed by inverse nano-emulsion or reprecipitation.

Specifically, a first solution was prepared by dissolving a perovskite in a polar solvent. The polar solvent used herein was dimethylformamide, and the perovskite used herein was $CH_3NH_3PbBr_3$. The $CH_3NH_3PbBr_3$ used herein was prepared by mixing $CH_3NH_3Br$ with $PbBr_2$ at a ratio of 1:1.

In addition, a second solution was prepared by dissolving an alkyl halide surfactant in a non-polar solvent. The non-polar solvent used herein was toluene, and the alkyl halide surfactant used herein was octadecylammonium bromide ($CH_3(CH_2)_{17}NH_3Br$).

Subsequently, the first solution was slowly added dropwise to the second solution while harshly stirring, thereby forming aperovskite particle light-emitter having a 3D structure.

Afterward, such a perovskite particle solution was applied on a glass substrate by spin coating, thereby forming a perovskite particle film with or without a polymer.

The perovskite particle formed herein has a size of approximately 20 nm.

Preparation Example 2

A perovskite particle light-emitter having a 3D structure according to an exemplary embodiment of the present invention was formed using $CH_3(CH_2)_{13}NH_3Br$ as an alkyl halide surfactant in the same manner as described in Preparation Example 1.

The perovskite particle formed herein has a size of approximately 100 nm.

Preparation Example 3

A perovskite particle light-emitter having a 3D structure according to an exemplary embodiment of the present invention was formed using $CH_3(CH_2)_{10}NH_3Br$ as an alkyl halide surfactant in the same manner as described in Preparation Example 1.

The perovskite particle formed herein has a size of approximately 300 nm.

Preparation Example 4

A perovskite particle light-emitter having a 3D structure according to an exemplary embodiment of the present invention was formed using $CH_3(CH_2)_7NH_3Br$ as an alkyl halide surfactant in the same manner as described in Preparation Example 1.

The perovskite particle formed herein has a size of approximately 500 nm.

Preparation Example 5

A perovskite particle light-emitter having a 3D structure according to an exemplary embodiment of the present invention was formed using $CH_3(CH_2)_4NH_3Br$ as an alkyl halide surfactant in the same manner as described in Preparation Example 1.

The perovskite particle formed herein has a size of approximately 700 nm.

Preparation Example 6

A perovskite particle light-emitter having a 3D structure according to an exemplary embodiment of the present invention was formed using $CH_3CH_2NH_3Br$ as an alkyl halide surfactant in the same manner as described in Preparation Example 1.

The perovskite particle formed herein has a size of approximately 800 nm.

Preparation Example 7

A perovskite particle light-emitter having a 3D structure according to an exemplary embodiment of the present invention was formed using $CH_3NH_3Br$ as an alkyl halide surfactant in the same manner as described in Preparation Example 1.

The perovskite particle formed herein has a size of approximately 900 nm.

Preparation Example 8

The perovskite nanocrystal according to Preparation Example 1 was used as a core.

In addition, a second wide band-gap perovskite ($MAPbCl_3$) solution was slowly added dropwise to a solution containing such a perovskite nanocrystal core, thereby forming a shell including a second perovskite nanocrystal ($MAPbCl_3$). As a result, a core-shell structured perovskite particle light-emitter according to an exemplary embodiment of the present invention was formed.

Preparation Example 9

The perovskite nanocrystal according to Preparation Example 2 was used as a core. In addition, a second wide band-gap perovskite ($MAPbCl_3$) solution was slowly added dropwise to a solution containing such a perovskite nanocrystal core, thereby forming a shell including a second perovskite nanocrystal ($MAPbCl_3$). As a result, a core-shell structured perovskite particle light-emitter according to an exemplary embodiment of the present invention was formed.

Preparation Example 10

The perovskite nanocrystal according to Preparation Example 3 was used as a core. In addition, a second wide band-gap perovskite (MAPbCl$_3$) solution was slowly added dropwise to a solution containing such a perovskite nanocrystal core, thereby forming a shell including a second perovskite nanocrystal (MAPbCl$_3$). As a result, a core-shell structured perovskite particle light-emitter according to an exemplary embodiment of the present invention was formed.

Preparation Example 11

The perovskite nanocrystal according to Preparation Example 4 was used as a core. In addition, a second wide band-gap perovskite (MAPbCl$_3$) solution was slowly added dropwise to a solution containing such a perovskite nanocrystal core, thereby forming a shell including a second perovskite nanocrystal (MAPbCl$_3$). As a result, a core-shell structured perovskite particle light-emitter according to an exemplary embodiment of the present invention was formed.

Preparation Example 12

The perovskite nanocrystal according to Preparation Example 5 was used as a core. In addition, a second wide band-gap perovskite (MAPbCl$_3$) solution was slowly added dropwise to a solution containing such a perovskite nanocrystal core, thereby forming a shell including a second perovskite nanocrystal (MAPbCl$_3$). As a result, a core-shell structured perovskite particle light-emitter according to an exemplary embodiment of the present invention was formed.

Preparation Example 13

The perovskite nanocrystal according to Preparation Example 6 was used as a core. In addition, a second wide band-gap perovskite (MAPbCl$_3$) solution was slowly added dropwise to a solution containing such a perovskite nanocrystal core, thereby forming a shell including a second perovskite nanocrystal (MAPbCl$_3$). As a result, a core-shell structured perovskite particle light-emitter according to an exemplary embodiment of the present invention was formed.

Preparation Example 14

The perovskite nanocrystal according to Preparation Example 7 was used as a core. In addition, a second wide band-gap perovskite (MAPbCl$_3$) solution was slowly added dropwise to a solution containing such a perovskite nanocrystal core, thereby forming a shell including a second perovskite nanocrystal (MAPbCl$_3$). As a result, a core-shell structured perovskite particle light-emitter according to an exemplary embodiment of the present invention was formed.

Preparation Example 15

A process was carried out in the same manner as described in Preparation Example 8, but (CH$_3$NH$_3$)$_2$PbBr$_4$ was used as a perovskite for a core. The (CH$_3$NH$_3$)$_2$PbBr$_4$ used herein was prepared by mixing CH$_3$NH$_3$Br with PbBr$_2$ at a ratio of 2:1.

The core-shell structured perovskite particle light-emitter formed herein emits UV light or light blue light. In the photoluminescence spectrum, the emission band was located at approximately 520 nm.

Preparation Example 16

A process was carried out in the same manner as described in Preparation Example 8, but (CH$_3$NH$_3$)$_2$PbI$_4$ was used as a perovskite for a core. The (CH$_3$NH$_3$)$_2$PbI$_4$ used herein was prepared by mixing CH$_3$NH$_3$I with PbI$_2$ at a ratio of 2:1.

The core-shell structured perovskite particle formed herein emits IR light or light red light. In the photoluminescence spectrum, the emission band was located at approximately 780 nm.

Preparation Example 17

A process was carried out in the same manner as described in Preparation Example 8, but (CH$_3$NH$_3$)$_2$PbCl$_x$Br$_{4-x}$ was used as a perovskite for a core. The (CH$_3$NH$_3$)$_2$PbCl$_x$Br$_{4-x}$ used herein was prepared by mixing CH$_3$NH$_3$Cl with PbBr$_2$ at a certain ratio.

The emission band in the photoluminescence spectrum of the core-shell structured perovskite particle formed herein was located in a range between 380 nm and 520 nm.

Preparation Example 18

A process was carried out in the same manner as described in Preparation Example 8, but (CH$_3$NH$_3$)$_2$PbI$_x$Br$_{4-x}$ was used as a perovskite for a core. The (CH$_3$NH$_3$)$_2$PbI$_x$ Br$_{4-x}$ used herein was prepared by mixing CH$_3$NH$_3$I with PbBr$_2$ at a certain ratio.

The emission band in the photoluminescence spectrum of the core-shell structured perovskite particle formed herein was located in a range between 520 nm and 780 nm.

Preparation Example 19

A process was carried out in the same manner as described in Preparation Example 8, but (CH(NH$_2$)$_2$)$_2$PbI$_4$ was used as a perovskite for a core. The (CH(NH$_2$)$_2$)$_2$PbI$_4$ was prepared by mixing CH(NH$_2$)$_2$I with PbI$_2$ at a ratio of 2:1.

The core-shell structured perovskite particle formed herein emits IR light, and in the photoluminescence spectrum, the emission band was located at approximately 800 nm.

Preparation Example 20

A process was carried out in the same manner as described in Preparation Example 8, but (CH$_3$NH$_3$)$_2$Pb$_x$Sn$_{1-x}$I$_4$ was used as a perovskite for a core. The (CH$_3$NH$_3$)$_2$Pb$_x$Sn$_{1-x}$I$_4$ used herein was prepared by mixing CH$_3$NH$_3$I with Pb$_x$Sn$_{1-x}$I$_2$ at a ratio of 2:1.

The emission band in the photoluminescence spectrum of the core-shell structured perovskite particle formed herein was located in a range between 820 nm and 1120 nm.

Preparation Example 21

A process was carried out in the same manner as described in Preparation Example 8, but (CH$_3$NH$_3$)$_2$Pb$_x$Sn$_{1-x}$Br$_4$ was used as a perovskite for a core. The $(CH_3NH_3)_2Pb_xSn_{1-x}Br_4$ used herein was prepared by mixing $CH_3NH_3Br$ with $Pb_xSn_{1-x}Br_2$ at a ratio of 2:1.

The emission band in the photoluminescence spectrum of the core-shell structured perovskite particle formed herein was located in a range between 540 nm and 650 nm.

Preparation Example 22

A process was carried out in the same manner as described in Preparation Example 8, but $(CH_3NH_3)_2Pb_xSn_{1-x}Cl_4$ was used as a perovskite for a core. The $(CH_3NH_3)_2Pb_xSn_{1-x}Cl_4$ used herein was prepared by mixing $CH_3NH_3Cl$ with $Pb_xSn_{1-x}Cl_2$ at a ratio of 2:1.

The emission band of the photoluminescence spectrum of the core-shell structured perovskite particle formed herein was located in a range between 400 nm and 460 nm.

Preparation Example 23

A process was carried out in the same manner as described in Preparation Example 8, but $(C_4H_9NH_3)PbBr_4$ was used as a perovskite for a core. The $(C_4H_9NH_3)PbBr_4$ used herein was prepared by mixing $(C_4H_9NH_3)Br$ with $PbBr_2$ at a ratio of 2:1.

The emission band in the photoluminescence spectrum of the core-shell structured perovskite particle formed herein was located at approximately 411 nm.

Preparation Example 24

A process was carried out in the same manner as described in Preparation Example 8, but $(C_5H_{11}NH_3)PbBr_4$ was used as a perovskite for a core. The $(C_5H_{11}NH_3)PbBr_4$ used herein was prepared by mixing $(C_5H_{11}NH_3)Br$ with $PbBr_2$ at a ratio of 2:1.

The emission band in the photoluminescence spectrum of the core-shell structured perovskite particle formed herein was located at approximately 405 nm.

Preparation Example 25

A process was carried out in the same manner as described in Preparation Example 8, but $(C_7H_{15}NH_3)PbBr_4$ was used as a perovskite for a core. The $(C_7H_{15}NH_3)PbBr_4$ used herein was prepared by mixing $(C_7H_{15}NH_3)Br$ with $PbBr_2$ at a ratio of 2:1.

The emission band in the photoluminescence spectrum of the core-shell structured perovskite particle formed herein was located at approximately 401 nm.

Preparation Example 26

A process was carried out in the same manner as described in Preparation Example 8, but $(C_{12}H_{25}NH_3)PbBr_4$ was used as a perovskite for a core. The $(C_2H_{25}NH_3)PbBr_4$ used herein was prepared by mixing $(C_{12}H_{25}NH_3)Br$ with $PbBr_2$ at a ratio of 2:1.

The emission band in the photoluminescence spectrum of the core-shell structured perovskite particle formed herein was located at approximately 388 nm.

Preparation Example 27

An inorganic metal halide perovskite particle light-emitter having a 3D structure according to an exemplary embodiment of the present invention was formed. The inorganic metal halide perovskite particle light-emitter was formed by inverse nano-emulsion or hot injection method.

Specifically, cesium carbonate $(Cs_2CO_3)$ and oleic acid were added to octadecene (ODE) to allow a reaction at a high temperature, thereby preparing a third solution. PbBr2, oleic acid and oleylamine were added to ODE solvent to allow a reaction for 1 hour at a high temperature (120° C.), thereby preparing a fourth solution.

Subsequently, an inorganic metal halide perovskite particle light-emitter having a 3D structure was formed by slowly adding the first solution dropwise to the second solution while harshly stirring.

Afterward, such an inorganic metal halide perovskite particle solution was applied on a glass substrate by spin coating, thereby forming an inorganic metal halide perovskite particle film.

The inorganic metal halide perovskite particle formed herein has a size of approximately 20 nm.

Preparation Example 28

The inorganic metal halide perovskite $(CsPbBr_3)$ nanocrystal according to Preparation Example 27 was used as a core. In addition, a shell including a second inorganic metal halide perovskite nanocrystal $(CsPbCl_3)$ was formed by slowly adding a second wide band-gap inorganic metal halide perovskite $(CsPbCl_3)$ solution dropwise to a solution containing such an inorganic metal halide perovskite nanocrystal core, thereby forming a core-shell structured inorganic metal halide perovskite particle light-emitter according to an exemplary embodiment of the present invention.

Preparation Example 29

A light emitting device according to an exemplary embodiment of the present invention was manufactured.

First, an ITO substrate (an ITO anode-coated glass substrate) was prepared, a conductive substance PEDOT:PSS (AI4083 provided by Heraeus Group) was applied on the ITO anode by spin coating, and then the resulting substrate was thermally treated for 30 minutes at 150° C., thereby forming a hole injection layer with a thickness of 40 nm.

The hole injection layer was spin-coated with a solution in which the core-shell structured perovskite particle according to Preparation Example 8 was dissolved and thermally treated for 20 minutes at 80° C., thereby forming a perovskite particle light emitting layer.

Afterward, an electron transport layer was formed by depositing 1,3,5-tris(1-phenyl-1H-benzimidazol-2-yl)benzene (TPBI) on the perovskite particle light emitting layer to have a thickness of 50 nm under a high vacuum of $1 \times 10^{-7}$ Torr or less, an electron injection layer was formed by depositing lithium fluoride (LiF) thereon to have a thickness of 1 nm, and then a cathode was formed by depositing aluminum thereon to have a thickness of 100 nm, resulting in manufacturing a perovskite particle light emitting device.

Preparation Example 30

A solar cell according to an exemplary embodiment of the present invention was manufactured.

First, an ITO substrate (an ITO anode-coated glass substrate) was prepared, a conductive substance PEDOT:PSS (Clevios™ PH provided by Heraeus Group) was applied on the ITO anode by spin coating, and then the resulting substrate was thermally treated for 30 minutes at 150° C., thereby forming a hole extraction layer with a thickness of 40 nm.

A photoactive layer was formed by coating the hole extraction layer with a mixture of the core-shell structured perovskite particle according to Preparation Example 1 and phenyl-C61-butyric acid methyl ester (PCBM), and 100 nm-thick Al was directly deposited on the photoactive layer, thereby manufacturing a perovskite particle solar cell.

Comparative Example 1

A first solution was prepared by dissolving $CH_3NH_3PbBr_3$ in a polar solvent, such as dimethylformamide.

Subsequently, a $CH_3NH_3PbBr_3$ film was manufactured by spin-coating a glass substrate with the first solution.

Comparative Example 2

A first solution was prepared by dissolving $CH_3NH_3PbCl_3$ in a polar solvent, such as dimethylformamide.

Subsequently, a $CH_3NH_3PbCl_3$ film was manufactured by spin-coating a glass substrate with the first solution.

Experimental Example

Figure 7:
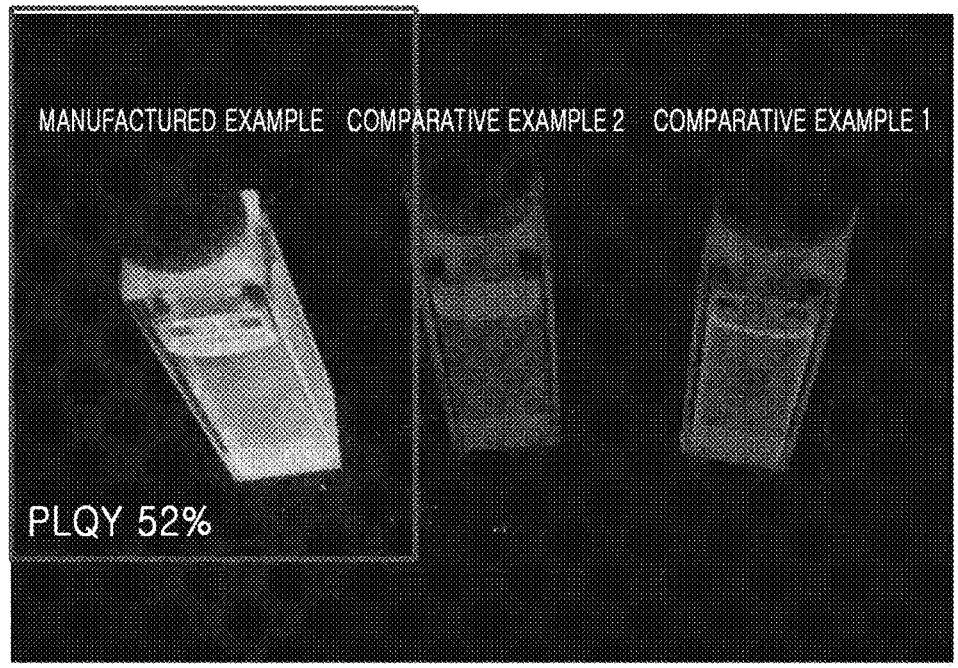
FIG. 7 shows fluorescence images obtained by taking light emitted by UV irradiation to light-emitters according to Preparation Example 1 and Comparative Examples 1 and 2, respectively.

FIG. 7 shows fluorescence images obtained by taking light emitted by UV irradiation to light-emitters according to Preparation Example 1 and Comparative Examples 1 and 2, respectively.

Referring to FIG. 7, it can be identified that the bulk-type perovskite solutions according to Comparative Examples 1 and 2, other than the nanocrystal-type solution, emit dark light, whereas the nanocrystal-type light-emitter according to Preparation Example 1 emits very bright green light.

It can also be identified that the perovskite particle light-emitter according to Preparation Example 1 shows a very high photoluminescence quantum yield (PLQY) of 52%.

Contrarily, in Comparative Examples 1 and 2, the film-type perovskites formed on the glass substrates by spin coating showed low PLQY of less than 1%.

Figure 8:
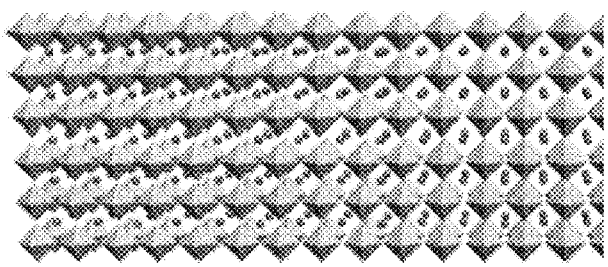
FIG. 8 shows schematic diagrams of the light-emitters according to Preparation Example 1 and Comparative Example 1, respectively.
Figure 8:
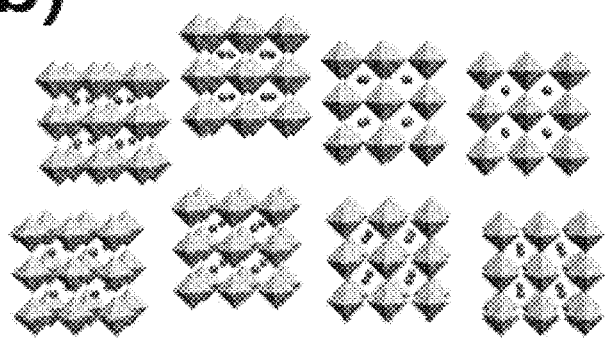

FIG. 8 shows schematic diagrams of the light-emitters according to Preparation Example 1 and Comparative Example 1, respectively.

FIG. 8(A) is a schematic diagram of the light-emitter film according to Comparative Example 1, and FIG. 8(B) is a schematic diagram of the light-emitter film according to Preparation Example 1. Referring to FIG. 8(A), Comparative Example 1 shows the film-type light-emitter formed by spin-coating a glass substrate with the first solution, and referring to FIG. 8(B), the light-emitter is a nanocrystal-type light-emitter 110 according to Preparation Example 1.

Figure 9:
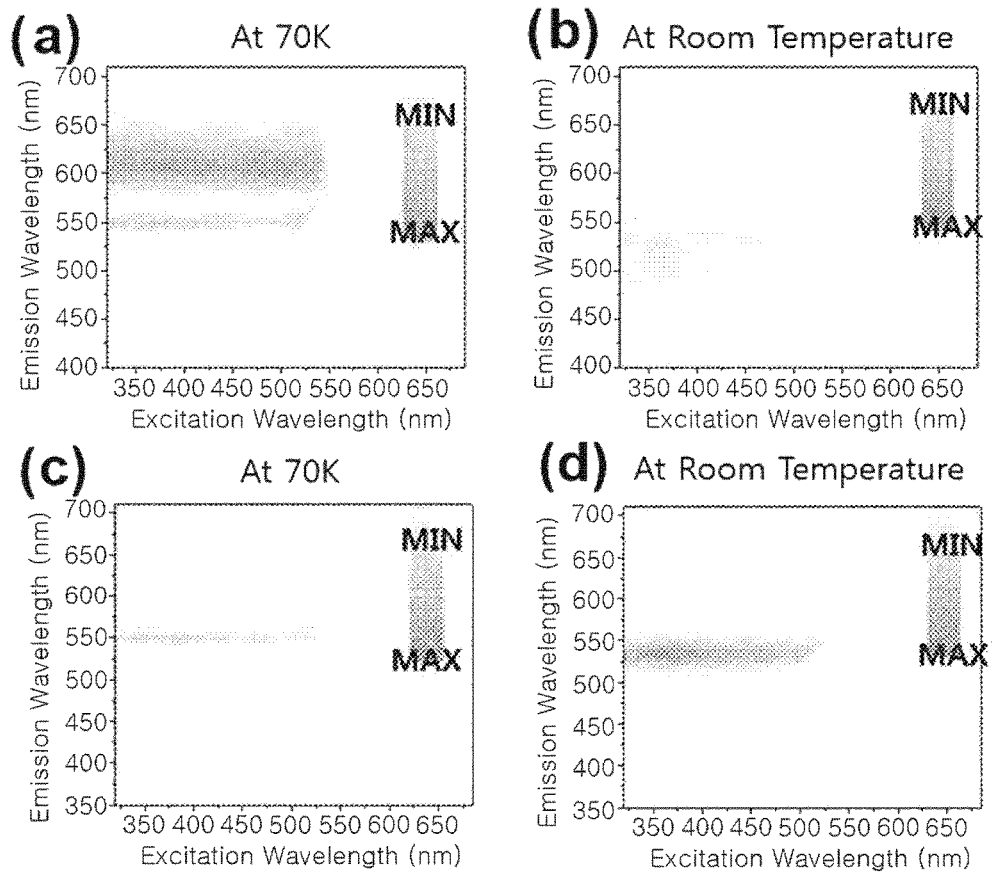
FIG. 9 shows images of the photoluminescence matrices of the light-emitters according to Preparation Example 1 and Comparative Example 1 at room temperature and a low temperature.

FIG. 9 shows images of the photoluminescence matrices of the light-emitters according to Preparation Example 1 and Comparative Example 1 at room temperature and a low temperature.

FIG. 9(A) is an image of a photoluminescence matrix of the film-type perovskite according to Comparative Example 1 at a low temperature (70 K), and FIG. 9(B) is an image of a photoluminescence matrix of the film-type perovskite according to Comparative Example 1 at room temperature.

FIG. 9(C) is an image of a photoluminescence matrix of the perovskite particle film according to Preparation Example 1 at a low temperature (70 K), and FIG. 9(D) is an image of a photoluminescence matrix of the perovskite particle film according to Preparation Example 1 at room temperature.

Referring to FIGS. 9(A) to 9(D), it can be seen that the perovskite particle film according to Preparation Example 1 shows photoluminescence at the same location and a little higher color purity, relative to the film-type perovskite according to Comparative Example 1. In addition, the perovskite film according to Preparation Example 1 shows photoluminescence at the same location and a high color purity at room temperature, but does not show a decrease in photoluminescence intensity, relative to that at a low temperature. Contrarily, the film-type perovskite according to Comparative Example 1 shows different color purities and photoluminescence locations at room temperature and a low temperature, and shows a lower photoluminescence intensity at room temperature because excitons are not emitted but separated into free charges and then annihilation due to thermal ionization and delocalization of charge carriers.

Figure 10:
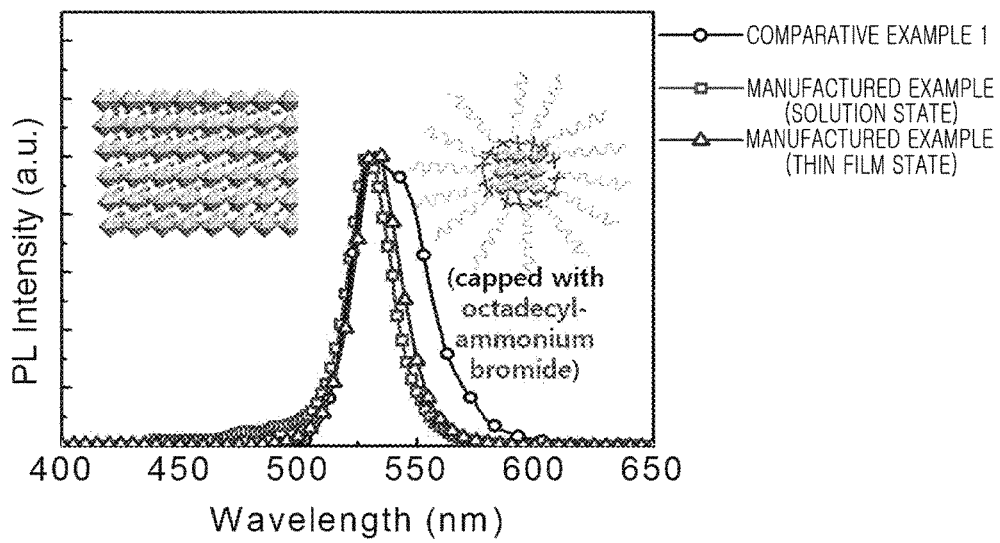
FIG. 10 is a graph showing photoluminescence of the light-emitters according to Preparation Example 1 and Comparative Example 1.

FIG. 10 is a graph showing photoluminescence of the light-emitters according to Preparation Example 1 and Comparative Example 1.

Referring to FIG. 10, when the perovskite particle light-emitter according to Preparation Example 1 is located in a solution, thereby preparing a solution-type light-emitter, and is prepared in a film, it can be seen that both types of light-emitters show photoluminescence at the same location and a little higher color purities, compared to the perovskite according to Comparative Example 1.

Figure 11:
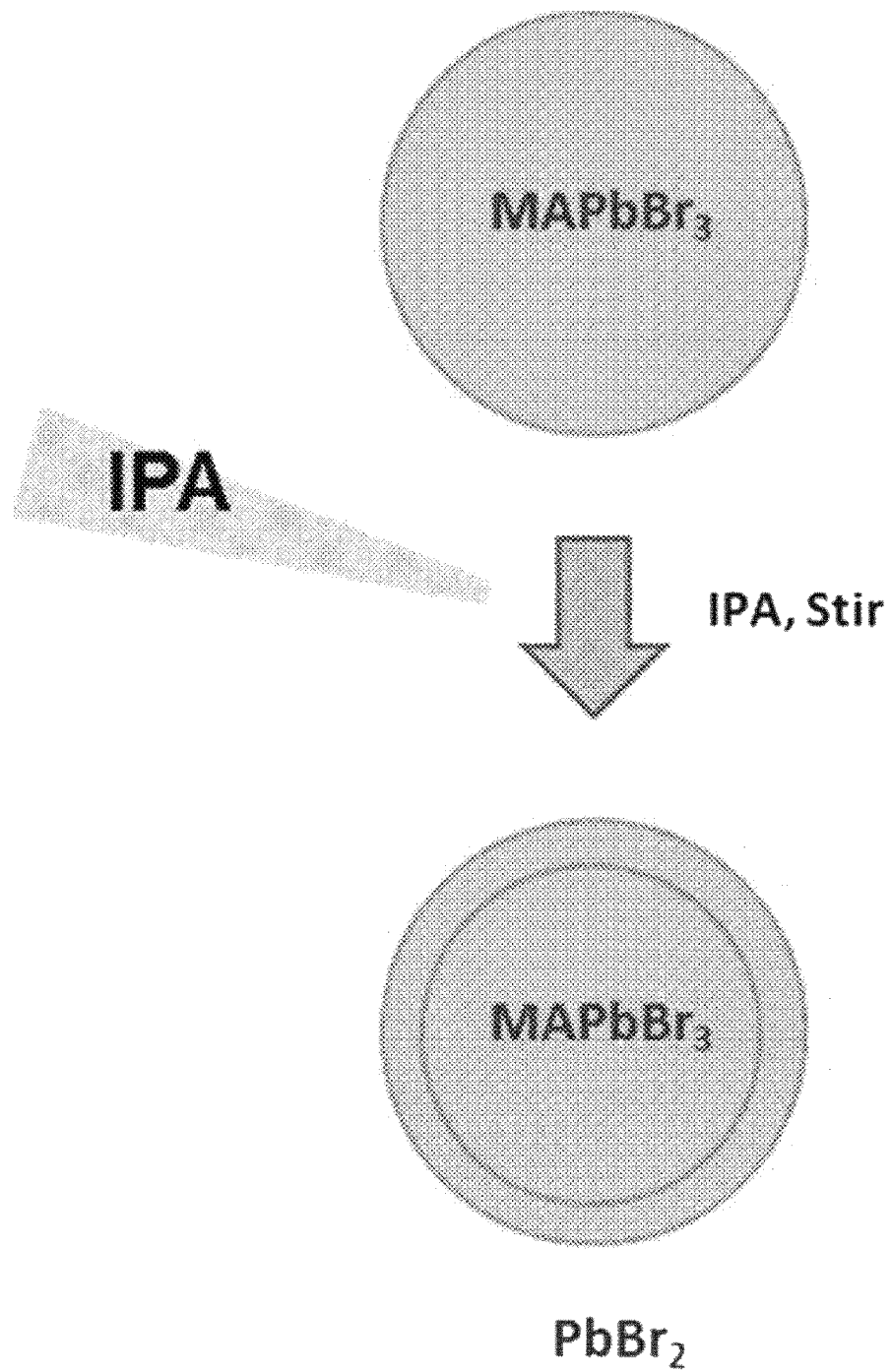
FIG. 11 is a conceptual diagram illustrating a method of preparing a core-shell structured perovskite particle light-emitter according to the present invention.

FIG. 11 is a conceptual diagram illustrating a process of forming the perovskite particle light-emitter according to Preparation Example 1 in a core-shell structure using an isopropyl alcohol (IPA) solution.

Referring to FIG. 11, a small amount of IPA solution was dropped to a second solution containing the perovskite particle light-emitter ($MAPbBr_3$) according to Preparation Example 1, and then stirred. Here, MA in Preparation Example 1 refers to $CH_3NH_3$. In this case, only $CH_3NH_3Br$ on the surface of the particle light-emitter is selectively extracted due to IPA, and thus $PbBr_2$ only remains on the surface, thereby forming a shell. Therefore, a core-shell structured particle light-emitter may be formed.

Figure 12:
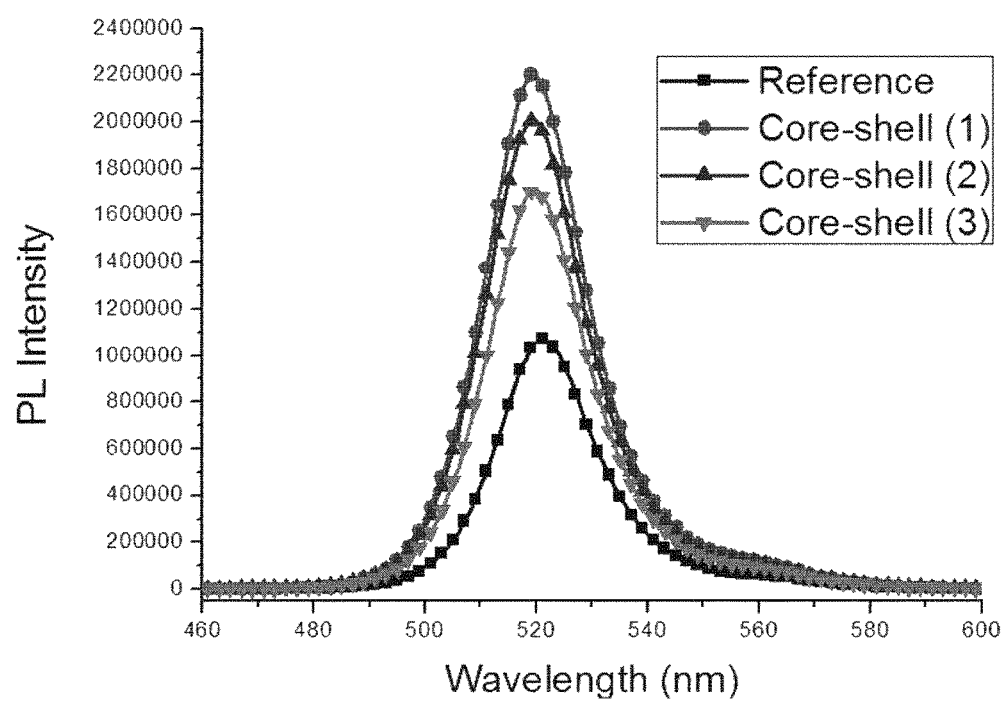
FIG. 12 is a graph showing photoluminescence intensities of core-shell structured perovskite particle light-emitters according to the present invention.

FIG. 12 is a graph showing photoluminescence intensities of core-shell structured perovskite particle light-emitters according to the present invention.

The perovskite particle light-emitter according to Preparation Example 1 is set as a reference.

20 μl, 40 μl or 60 μl of an IPA solution was added to approximately 5 ml of a second solution in which 0.6 mol of the perovskite particle light-emitter was formed according to Preparation Example 1 and then stirred, thereby forming a light-emitter having a core-shell (1) structure, a core-shell (2) structure, or a core-shell (3) structure, respectively.

It can be seen that the particle light-emitter having the core-shell (1) structure, the core-shell (2) structure, or the core-shell (3) structure shows a stronger photoluminescence than the particle light-emitter according to Preparation Example 1.

Figure 13:
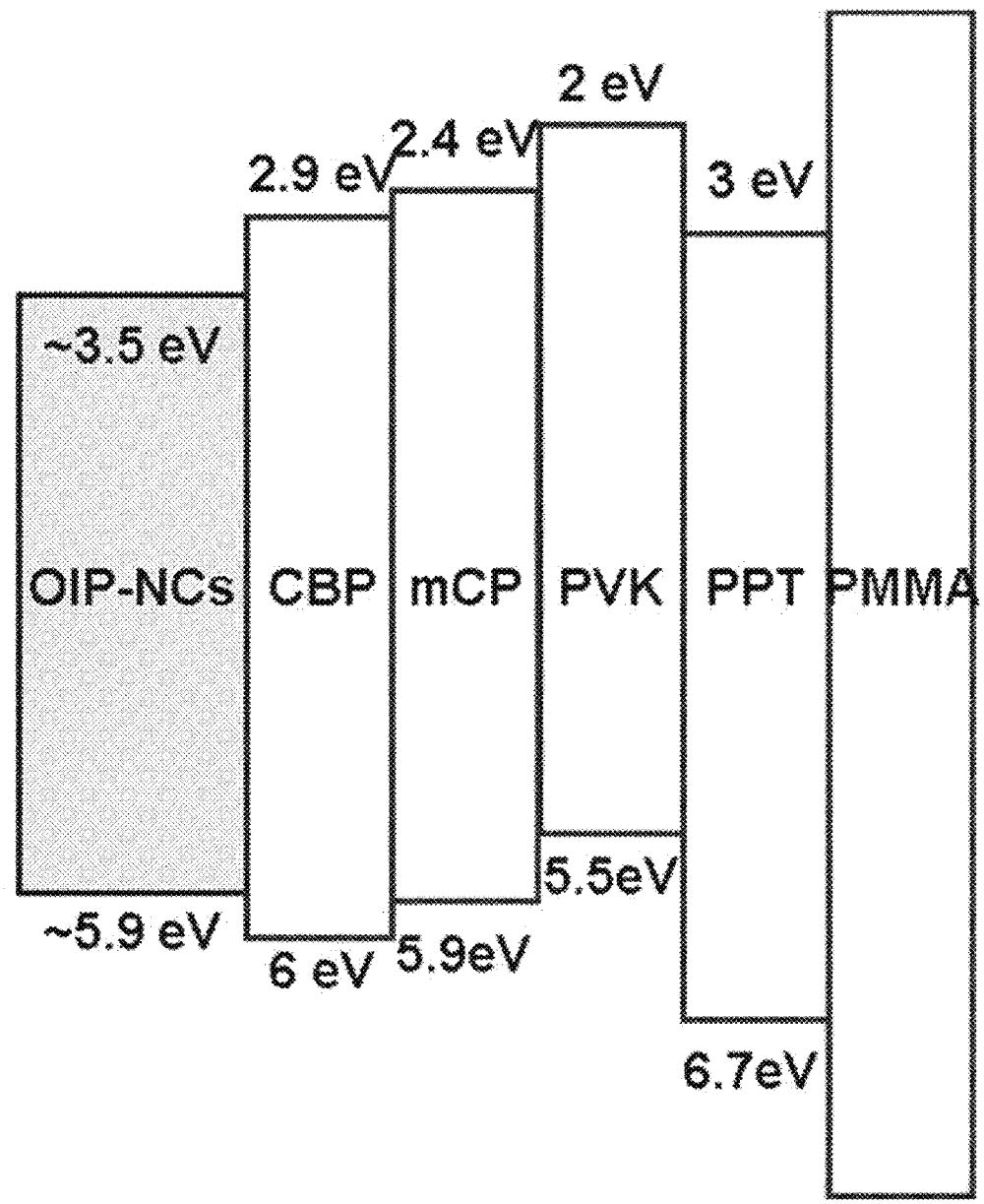
FIG. 13 is a diagram of band gaps of shell substances according to the present invention.

FIG. 13 is a diagram of band gaps of shell substances according to the present invention.

Referring to FIG. 13, when a surface of the perovskite particle light-emitter according to Preparation Example 1 was coated with an organic/polymer substance such as CBP, mCP, PVK, PPT or PMMA, which has a wider band gap than the nanocrystal, a nanocrystal having a core (particle)-shell (organic substance) structure may be formed.

Figure 14:
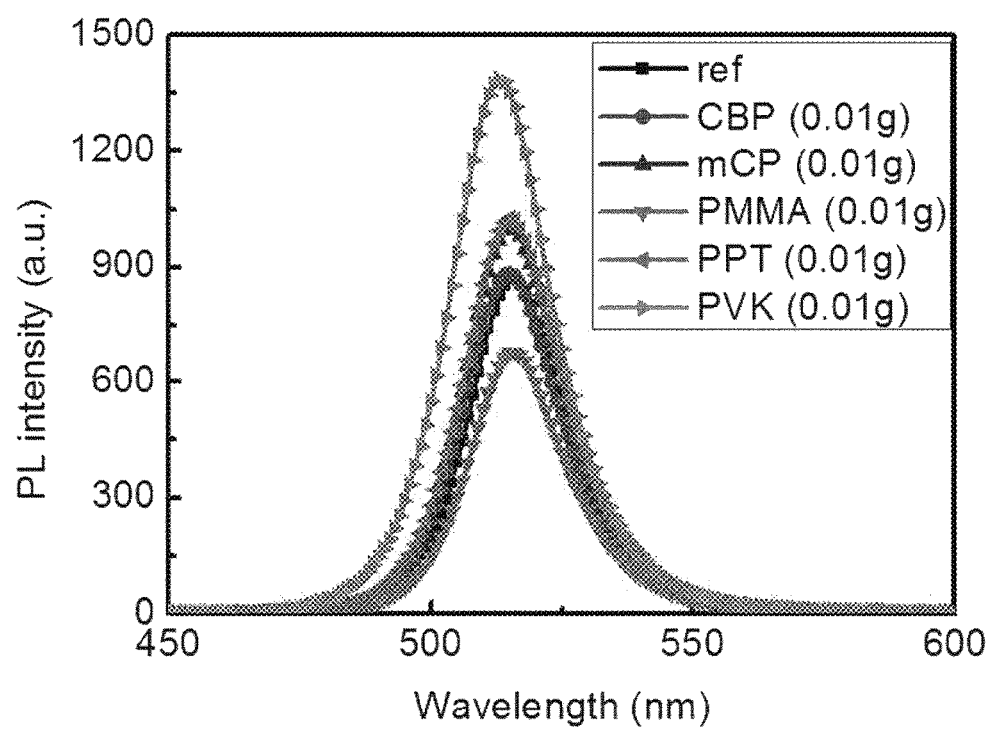
FIG. 14 is a graph showing photoluminescence intensities of core-shell structured perovskite particle light-emitters according to the present invention.

FIG. 14 is a graph showing photoluminescence (PL) intensities of core-shell structured perovskite particle light-emitters according to the present invention.

The perovskite particle light-emitter according to Preparation Example 1 is set as a reference.

In addition, a process was carried out in the same manner as described in Preparation Example 1, except that an organic substance for a shell was also dissolved in a second solution in which an alkyl halide surfactant is dissolved in a non-polar solvent, and then the first solution was slowly added dropwise thereto, thereby forming a core (particle)-shell (organic substance) structured particle light-emitter in which the surface of the perovskite particle light-emitter was covered with an organic substance having a wider band gap than the nanocrystal with any thickness.

Here, 0.01 g each of CBP, mCP, PMMA, PPT and PVK as the added organic substance for a shell was added, thereby forming core-shell structured particle light-emitters, respectively.

As a result, it can be seen that the core (particle)-shell (organic substance) structured particle light-emitter shows stronger photoluminescence (PL) than that of the particle light-emitter according to Preparation Example 1.

The particle light-emitter including a perovskite nanocrystal or inorganic metal halide perovskite nanocrystal according to the present invention has a perovskite or inorganic metal halide perovskite with a combined crystalline structure of FCC and BCC therein, can have a lamella or layered structure in which an organic plane and an inorganic plane are alternately stacked, and exhibits high color purity because excitons are confined in the inorganic plane.

In addition, since an exciton diffusion length is reduced and exciton binding energy is increased in the nanocrystal having a size of 900 nm or less, exciton annihilation caused by thermal ionization and delocalization of charge carriers is prevented, and therefore the particle light-emitter may have high luminescence efficiency at room temperature.

In addition, band gap energy of the perovskite particle or inorganic metal halide perovskite particle depends on a crystal structure, not on a particle size.

Further, compared to a 3D perovskite, a 2D perovskite may be synthesized as a nanocrystal, thereby increasing the exciton binding energy, and thus further improving luminescence efficiency, and increasing durability-stability.

Moreover, in the core-shell structured perovskite particle light-emitter or inorganic metal halide perovskite particle light-emitter formed according to the present invention, as a shell is formed of a substance having a wider band gap than a core, excitons may be more strongly confined in the core, and durability of the nanocrystal may be improved to prevent exposure of the core perovskite to the air using a perovskite or inorganic semiconductor, insulating substance, which is stable in the air, or a polymer.

Meanwhile, the embodiments disclosed in the specification and drawings are only illustrated to help in understanding the present invention, and are not intended to limit the scope of the present invention. It will be apparent to those of ordinary skill in the art that other modifications based on the technical idea of the present invention are possible to be realized, in addition to the embodiments disclosed herein.

EXPLANATION OF REFERENCE NUMERALS

100: Perovskite particle light-emitter
100': Core-shell structured perovskite particle light-emitter
110: Perovskite nanocrystal core
120: Organic ligand 130: Shell

The invention claimed is:

1. A core-shell structured perovskite particle comprising:
a core comprising at least one first halide perovskite nanocrystal; and
a shell surrounding the core,
wherein the shell comprises a second halide perovskite material different from a material of the first halide perovskite nanocrystal and wherein the shell has a different halogen element from the material of the first halide perovskite nanocrystal,
wherein the core, unlike quantum dots, has a first band gap energy determined by a perovskite crystal structure of the at least one first halide perovskite nanocrystal rather than the size thereof,
wherein a plurality of ligands are attached to a surface of the shell and are configured to make the at least one first halide perovskite nanocrystal more dispersible in a medium than without such ligands, and
wherein the at least one first halide perovskite nanocrystal has an $ABX_3$, $A_2BX_4$, or $ABX_4$, where A is an organic ammonium or metal, B is a metal, and X is a halogen.

2. The core-shell structured perovskite particle of claim 1, wherein the core-shell structured perovskite particle is dispersible in an organic solvent.

3. The core-shell structured perovskite particle of claim 1, wherein the at least one first halide perovskite nanocrystal has a spherical, cylindrical, elliptic cylindrical or polygonal cylindrical, or two-dimensional (lamellar, plate) shape.

4. The core-shell structured perovskite particle of claim 1, wherein the at least one first halide perovskite nanocrystal has a two-dimensional (2D) or three-dimensional (3D) structure.

5. The core-shell structured perovskite particle of claim 1,
wherein A is at least one selected from the group consisting of $(CH_3NH_3)_n$, $((C_xH_{2x+1})_nNH_2)CH_2NH_3)_n$, $R(NH_2)_2$, $(C_nH_{2n+1}NH_3)_n$, $(CF_3NH_3)$, $(CF_3NH_3)_n$, $((C_xF_{2x+1})_nNH_2)(CF_2NH_3)_n$, $((C_xF_{2x+1})_nNH_3)_n$, $(C_nF_{2n+1}NH_3)_n$, and metal (R is alkyl or fluoroalkyl, n is an integer of 1 or higher, and x is an integer of 1 or higher),
wherein B is at least one selected from the group consisting of a divalent transition metal, an organic molecule, a rare earth metal, an alkali earth metal, Pb, Sn, Ge, Ga, In, Al, Sb, Bi, and Po, and
wherein X is at least one selected from the group consisting of Cl, Br, and I.

6. The core-shell structured perovskite particle of claim 1, wherein the material of the shell comprises an inorganic compound having at least one halide.

7. A core-shell structured perovskite particle comprising:
a core comprising at least one halide perovskite nanocrystal; and
a shell surrounding the core,
wherein the shell comprises at least one selected from the group consisting of an inorganic semiconductor and an inorganic insulating substance,
wherein the core, unlike quantum dots, has a band gap energy determined by a perovskite crystal structure of the at least one halide perovskite nanocrystal rather than the size thereof,
wherein a plurality of ligands are attached to surface of the shell and are configured to make the at least one halide perovskite nanocrystal more dispersible in a medium than without such ligands, and wherein the at least one halide perovskite nanocrystal has an $ABX_3$, $A_2BX_4$, or $ABX_4$, where A is an organic ammonium or metal, B is a metal, and X is a halogen.

8. The core-shell structured perovskite particle of claim 7, wherein the inorganic semiconductor or the inorganic insulating substance comprises at least one selected from the group consisting of $TiO_x$ (x is a real number of 1 to 3), indium oxide, tin oxide, zinc oxide, zinc tin oxide, gallium oxide, tungsten oxide, aluminum oxide, titanium oxide, vanadium oxide, molybdenum oxide, iron oxide, chromium oxide, bismuth oxide, indium-gallium zinc oxide (IGZO), $ZrO_2$, nickel oxide, copper (II) oxide, copper aluminum oxide, zinc rhodium oxide, lithium fluoride (LiF), hydrogen sulfide, cadmium sulfide, carbon disulfide, lead sulfide, molybdenum disulfide, silver sulfide, sodium sulfide, zinc sulfide, mercury sulfide, arsenic sulfide, selenium sulfide, and iron disulfide.

9. The core-shell structured perovskite particle of claim 1, wherein the plurality of ligands comprises at least one selected from the group consisting of an alkyl halide, an alkyl amine, and a surfactant.

10. The core-shell structured perovskite particle of claim 9, wherein the alkyl halide comprises a $C_nH_{2n+1}$ structure with or without at least one additional moiety selected from an acyclic alkyl, a primary alcohol, a secondary alcohol, a tertiary alcohol, an alkyl amine, p-substituted aniline, phenyl ammonium, and fluorine ammonium.

11. A core-shell structured inorganic metal halide perovskite particle comprising:
a core comprising at least one inorganic metal halide perovskite nanocrystal; and
a shell surrounding the core,
wherein the at least one inorganic metal halide perovskite nanocrystal has a size between about 20 nm to about 100 nm and, unlike quantum dots, has a first band gap energy determined by a perovskite crystal structure of the at least one inorganic metal halide perovskite nanocrystal rather than the size thereof,
wherein the shell comprises a material having a second band gap energy that is larger than the first band gap energy,
wherein a plurality of ligands are attached to surface of the shell and are configured to make the at least one inorganic metal halide perovskite nanocrystal more dispersible in a medium than without such ligands, and
wherein the at least one inorganic metal halide perovskite nanocrystal has an $ABX_3$, $A_2BX_4$, or $ABX_4$ structure, where A is a metal, B is a metal, and X is a halogen.

12. The core-shell structured inorganic metal halide perovskite particle of claim 11, wherein A comprises at least one selected from the group consisting of Na, K, Rb, Cs and Fr.

13. A light emitting device, comprising:
a first electrode;
a second electrode; and
a light emitting layer disposed between the first electrode and the second electrode, wherein the light emitting layer comprises the core-shell structured perovskite particle of claim 1.

14. A solar cell, comprising:
a first electrode;
a second electrode; and
a photoactive layer disposed between the first electrode and the second electrode,
wherein the photoactive layer comprises the core-shell structured perovskite particle of claim 1.

15. A core-shell structured perovskite particle comprising:
a core comprising at least one halide perovskite nanocrystal; and
a shell surrounding the core,
wherein the at least one halide perovskite nanocrystal unlike a quantum dot has a first band gap energy determined by a perovskite crystal structure of the at least one halide perovskite nanocrystal rather than the size thereof,
wherein the shell comprises a material having a second band gap energy that is larger than the first band gap energy,
wherein a plurality of ligands attached to the at least one halide perovskite nanocrystal and configured to make the at least one halide perovskite nanocrystal more dispersible than without such ligand in a medium, and
wherein the at least one halide perovskite nanocrystal has an $ABX_3$, $A_2BX_4$, or $ABX_4$ structure, where A is an organic ammonium or metal, B is a metal, and X is a halogen.

16. The core-shell structured perovskite particle of claim 15, wherein the plurality of ligands includes an alkyl halide selected from the group consisting of an acyclic alkyl having a $C_nH_{2n+1}$ structure, a primary alcohol, a secondary alcohol, a tertiary alcohol, an alkylamine, a p-substituted aniline, a phenyl ammonium or fluorine ammonium, surrounding the core or the shell.

17. The core-shell structured perovskite particle of claim 1, wherein the shell comprises a material having a second band gap energy that is larger than the first band gap energy of the core.

18. The core-shell structured perovskite particle of claim 7, wherein the plurality of ligands comprises at least one selected from the group consisting of an alkyl halide, an alkyl amine, and a surfactant.

* * * * *